(12) United States Patent
Zhu

(10) Patent No.: US 10,800,083 B2
(45) Date of Patent: Oct. 13, 2020

(54) GLUE INJECTION APPARATUS

(71) Applicant: Suzhou Konig Electronic Technology Co., Ltd., Changshu, Jiangsu Province (CN)

(72) Inventor: Jianxiao Zhu, Changshu (CN)

(73) Assignee: Suzhou Konig Electronic Technology Co., Ltd., Changshu (CN)

( * ) Notice: Subject to any disclaimer, the term of this patent is extended or adjusted under 35 U.S.C. 154(b) by 355 days.

(21) Appl. No.: 15/983,000

(22) Filed: May 17, 2018

(65) Prior Publication Data

US 2018/0297258 A1    Oct. 18, 2018

Related U.S. Application Data

(63) Continuation of application No. PCT/CN2016/105669, filed on Nov. 14, 2016.

(30) Foreign Application Priority Data

| Nov. 17, 2015 | (CN) | 2015 1 0767922 |
| May 24, 2016 | (CN) | 2016 1 0348485 |
| Oct. 28, 2016 | (CN) | 2016 1 0970872 |

(51) Int. Cl.
  *B29C 45/00*   (2006.01)
  *B29C 45/46*   (2006.01)
  (Continued)

(52) U.S. Cl.
  CPC .......... *B29C 45/464* (2013.01); *B29C 45/46* (2013.01); *B29C 45/53* (2013.01); *B29C 45/74* (2013.01);
  (Continued)

(58) Field of Classification Search
  CPC .................................................. B29C 45/464
  See application file for complete search history.

(56) References Cited

U.S. PATENT DOCUMENTS

| 3,577,841 A | 5/1971 | Massy et al. |
| 2001/0053392 A1 | 12/2001 | Suganuma et al. |

(Continued)

FOREIGN PATENT DOCUMENTS

| CN | 101816997 A | 9/2010 |
| CN | 202156019 | 3/2012 |

(Continued)

OTHER PUBLICATIONS

WIPO, International search report issued for counterpart International PCT Patent Application No. PCT/CN2016/105669, dated Jan. 24, 2017, 2 pages.

(Continued)

*Primary Examiner* — Timothy Kennedy
(74) *Attorney, Agent, or Firm* — Loza & Loza, LLP; Michael F. Fedrick

(57) ABSTRACT

Provided is a glue injection device, comprising: a glue melting unit (400), the glue melting unit (400) comprising a rotatable turntable (402) and a fixing member (403), wherein a feeding groove is provided on the surface of the turntable (402) facing the fixing member (403) and the turntable (402) melts the raw material in the feeding groove into glue when rotating with respect to the fixing member (403); and a glue injection unit (500) connected with the glue melting unit (400). The glue is injected into the glue injection unit (500) when the turntable (402) is rotated, and the glue injection unit (500) is capable of injecting the glue therein into a mold.

20 Claims, 20 Drawing Sheets

(51) Int. Cl.
B29C 45/53 (2006.01)
B29C 45/74 (2006.01)
B29C 45/78 (2006.01)
H05K 3/28 (2006.01)
B29C 45/77 (2006.01)
B29K 105/00 (2006.01)
B29L 31/34 (2006.01)

(52) U.S. Cl.
CPC .......... B29C 45/78 (2013.01); H05K 3/284 (2013.01); B29C 45/77 (2013.01); B29C 2045/465 (2013.01); B29C 2945/7604 (2013.01); B29C 2945/76006 (2013.01); B29C 2945/7618 (2013.01); B29C 2945/76498 (2013.01); B29C 2945/76531 (2013.01); B29C 2945/76658 (2013.01); B29K 2105/0097 (2013.01); B29L 2031/34 (2013.01); H05K 2203/1316 (2013.01); H05K 2203/1327 (2013.01)

(56) References Cited

U.S. PATENT DOCUMENTS

| | | |
|---|---|---|
| 2006/0099299 A1 | 5/2006 | Wang |
| 2007/0184146 A1 | 8/2007 | Takeuchi |
| 2018/0297258 A1 | 10/2018 | Zhu |

FOREIGN PATENT DOCUMENTS

| | | |
|---|---|---|
| CN | 102490309 A | 6/2012 |
| CN | 202344750 U | 7/2012 |
| CN | 203452990 | 2/2014 |
| CN | 203452990 U | 2/2014 |
| CN | 104647709 A | 5/2015 |
| CN | 105415568 A | 3/2016 |
| CN | 205467148 U | 8/2016 |
| CN | 106003559 A | 10/2016 |
| CN | 206254417 U | 6/2017 |
| CN | 206493542 U | 9/2017 |
| GB | 1041627 | 6/1964 |
| GB | 1079816 A | 8/1967 |
| JP | 5850993 | 11/1983 |
| JP | 61262107 | 11/1986 |
| JP | 2009137260 A | 6/2009 |
| WO | 2007119533 A1 | 10/2007 |

OTHER PUBLICATIONS

First Office Action and search report dated Jan. 9, 2019 for counterpart Chinese patent application No. 201610970066.2.
First Office Action and search report dated Jan. 9, 2019 for counterpart Chinese patent application No. 201610976768.1.
Office Action for Chinese Patent Application No. 201610970872.X dated Aug. 1, 2018, 13 pages.
Search Report for Chinese Patent Application No. 201610970872.X dated Aug. 1, 2018, 4 pages.
Second Office Action dated Sep. 9, 2019 for counterpart Chinese patent application No. 201610970066.2, along with machine EN translation downloaded from EPO, 10 pages.
Second Office Action dated Sep. 9, 2019 for counterpart Chinese patent application No. 201610976768.1, along with machine EN translation downloaded from EPO, 10 pages.
Extended European Search Report dated Jun. 13, 2019 for counterpart European patent application No. 16865720.3.

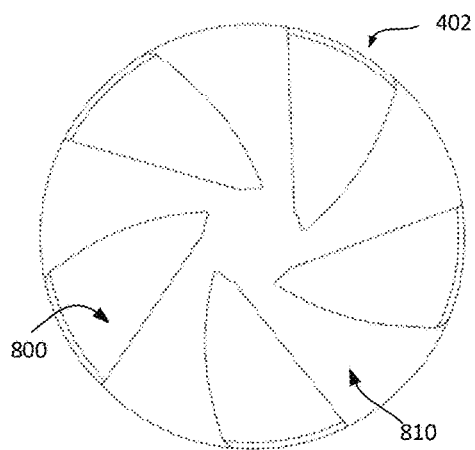
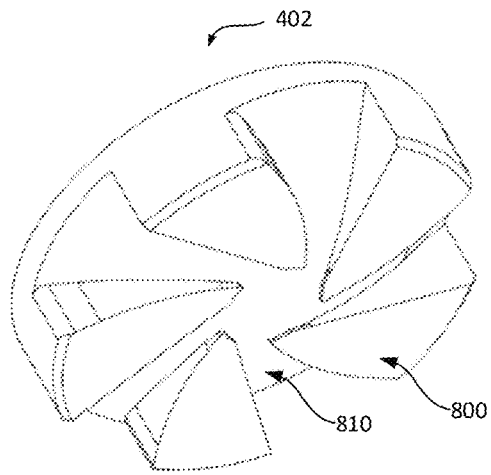
Fig. 17a
Fig. 17b
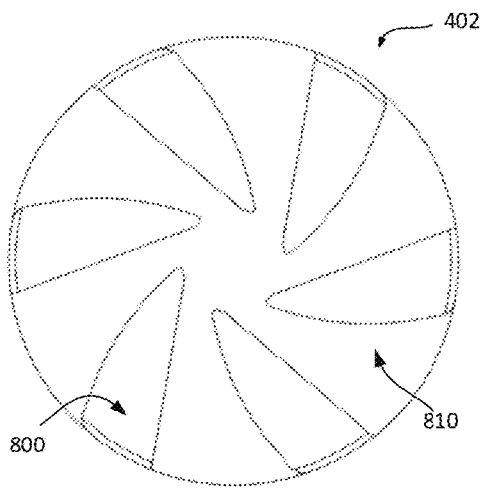
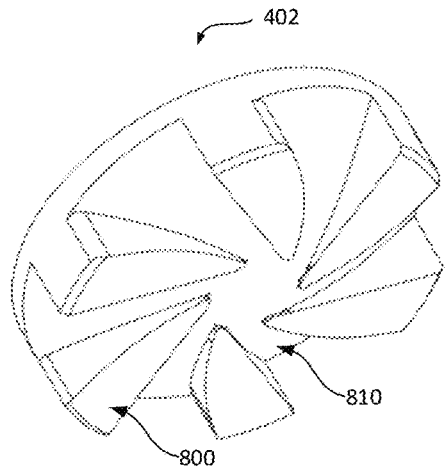
Fig. 18a
Fig. 18b

GLUE INJECTION APPARATUS

CROSS-REFERENCE TO RELATED APPLICATIONS

The present application is a continuation of International Patent Application No. PCT/CN2016/105669, filed on Nov. 14, 2016, which claims the benefit of priority under 35 U.S.C. § 119 from the following applications: Chinese Patent Application No. 201610970872.X, entitled "Glue Injection Apparatus", submitted on Oct. 28, 2016; Chinese Patent Application No. 201510767922.X, filed Nov. 17, 2015; and Chinese Patent Application No., filed May 24, 2016. The entire contents of the foregoing applications are incorporated by reference into the present application.

TECHNICAL FIELD

The present application relates to the field of injection molding, in particular to a glue injection apparatus.

BACKGROUND

The current low-pressure glue injection technology adopts a melt glue canister which has a certain capacity, and installs a heating tube and a temperature controller thereon to heat a solid particulate thermoplastic material placed therein to a set temperature. After the solid particulate thermoplastic material turns into liquid, a pump is used to increase pressure and a safety valve is used to measure the pressure, then the glue solution is delivered through a heat preservation heating tube and injected into a mold by a glue injection gun, thereby realizing a low-pressure packaging of circuit boards and electronic components placed in the mold.

Such a technology can indeed achieve the effect of low-pressure glue injection packaging, however, since the glue injection amount each time is small, the hot melt glue raw material placed in the glue cylinder cannot be used up within a short time, as such, the entire glue suffers from repeated heating and boiling under high temperature for a long time, which is bound to cause carbonization and aging phenomena of the thermoplastic raw material, thereby causing blockage of the glue injection flow path and the material delivering heating tube, and resulting in poor qualities of packaged products. Accordingly, various deficiencies of the glue injection packaged products will occur, which leads to increased defective rates. This is also the insolvable problem that harasses the low-pressure glue injection industry for a long time.

SUMMARY

With respect to the existing technical deficiency mentioned above, the purpose of the present invention is to provide a glue injection apparatus applicable to packaging electronic elements, so as to solve the phenomena of carbonization and aging of the glue to thereby avoid blockage of the flow path.

In order to achieve the purpose, the present application provides a glue injection apparatus, comprising:

a glue melting unit including a rotatable turntable and a fixed member, a feed groove being provided on a surface of the turntable facing the fixed member, a raw material in the feed groove being melted into glue solution when the turntable rotates relative to the fixed member;

a glue injection unit in communication with the glue melting unit, the glue solution entering the glue injection unit when the turntable rotates; the glue injection unit capable of injecting the glue solution inside it into a mold.

As a preferred embodiment, the turntable has a glue melting surface provided with the feed groove.

A groove width of the feed groove gradually decreases from a periphery to a center of the glue melting surface, and/or, a curvature change of a groove depth of the feed groove gradually decreases from the periphery to the center of the glue melting surface.

As a preferred embodiment, the turntable has a glue melting surface provided with the feed groove, and the glue melting surface protrudes or sinks from the periphery to the center thereof.

As a preferred embodiment, the feed groove extends along a straight line or a curved line.

As a preferred embodiment, a center of the fixed member is provided with a glue outlet through-hole in communication with the feed groove; the glue injection unit has a glue solution outlet; a glue solution flow path is provided between the glue outlet through-hole and the glue solution outlet; the glue solution flow path includes a vertical flow path and a horizontal flow path; an upper end of the vertical flow path is in communication with the glue outlet through-hole; and a lower end of the vertical flow path is in communication with the horizontal flow path.

As a preferred embodiment, the glue injection unit comprises:

a main body provided with a cavity;

an input one-way valve in communication with the cavity, which is opened when a pressure differential outside the cavity is greater than an internal pressure differential, so as to input the glue solution;

an output one-way valve in communication with the cavity, which opens when a pressure differential inside the cavity is greater than an external pressure differential, so as to expel the glue solution;

a plunger pump in communication with an interior of the cavity; the input one-way valve being opened and the output one-way valve being closed when the plunger pump executes a suction action; the output one-way valve being opened and the input one-way valve being closed when the plunger pump executes an expelling action.

As a preferred embodiment, a mounting hole is provided on a wall of the main body which is between the input one-way valve and the output one-way valve;

the plunger pump includes a plunger tube provided on the mounting hole and a plunger positioned inside the plunger tube.

As a preferred embodiment, the glue injection apparatus also comprises:

an electromagnetic heating unit capable of heating the fixed member by electromagnetic induction.

As a preferred embodiment, the electromagnetic heating unit is provided on a side of the fixed member facing away from the turntable; a heat preservation material is provided between the electromagnetic heating unit and the fixed member.

As a preferred embodiment, the glue injection apparatus also comprises: a temperature equalization unit provided with a heating mechanism and a temperature equalization cavity; the glue solution enters the temperature equalization cavity when the turntable rotates; the heating mechanism is capable of maintaining the glue solution in the temperature equalization cavity at a same temperature; and the temperature equalization unit is in communication with the glue injection unit so as to deliver the glue solution into the glue injection unit.

The advantageous effects of the present invention lies in: 1. the present invention can heat and melt the sizing material rapidly, thus totally eliminates the time generally wasted in waiting for the raw material to be melted in a glue cylinder in low-pressure injection molding production, and thereby greatly improves the production efficiency; 2. the present invention solves the long existed problem in low-pressure glue injection industry that the sizing material is carbonized by long time and repeated heating, which greatly influences the quality of the packaged products; 3. the present invention completely solves the problem about consistency of color aberration of the appearances of the low-pressure glue injection products; 4. the present invention breaks through the global problem that the low-pressure glue injection cannot be realized using materials with high hardness, high viscosity and high transparency; 5. control technology of equivalent amounts of melting and injection, i.e., melting as much raw material as the glue needed for the glue injection, which can reduce the waste of the raw material; 6. application of hot flow path technology, which produces no regrind material during the process of product packaging by low-pressure glue injection and thus achieves the highest state of "zero waste"; 7. realization of precise glue injection of low-pressure glue injection technology; 8. compact structure, small size, and convenient arrangement on an automatic assembly line to work.

Referring to the following Description and Figures, specific embodiments of the present invention have been disclosed in detail, and the modes in which the principle of the present invention can be used have been clearly pointed out. It should be appreciated that the embodiments of the present invention will not be limited thereby in scope. The embodiments of the present invention include a lot of alternations, modifications and equivalents within the scope of spirit and clauses of the appended claims.

Features that are described and/or illustrated with respect to one embodiment may be used in the same way or in a similar way in one or more other embodiments, in combination with or instead of the features of the other embodiments.

It should be emphasized that the term "comprises/comprising", when used in this text, is taken to specify the presence of features, integers, steps or components, but does not exclude the presence or addition of one or more other features, integers, steps, or components.

BRIEF DESCRIPTION OF THE DRAWINGS

In order to explain more clearly the embodiments in the present invention or the technical solutions in the prior art, the following text will briefly introduce the figures needed in the description of the embodiments or the prior art. Obviously, figures in the following description are only some embodiments of the present invention, and for a person skilled in the art, other figures may also be obtained based on these figures without paying creative efforts.

FIG. 10b is a stereogram of the turntable shown in FIG. 10a;

FIG. 11b is a stereogram of the turntable shown in FIG. 11a;

FIG. 12b is a stereogram of the turntable shown in FIG. 12a;

FIG. 13b is a stereogram of the turntable shown in FIG. 13a;

FIG. 14b is a stereogram of the turntable shown in FIG. 14a;

FIG. 15b is a stereogram of the turntable shown in FIG. 15a;

FIG. 16b is a stereogram of the turntable shown in FIG. 16a;

FIG. 17a is a schematic diagram of the turntable provided by another embodiment of the present application;

FIG. 17b is a stereogram of the turntable shown in FIG. 17a;

FIG. 18a is a schematic diagram of the turntable provided by another embodiment of the present application;

FIG. 18b is a stereogram of the turntable shown in FIG. 18a;

FIG. 19b is a stereogram of the turntable shown in FIG. 19a;

FIG. 20b is a stereogram of the turntable shown in FIG. 20a;

FIG. 21b is a stereogram of the turntable shown in FIG. 21a;

FIG. 22c is a stereogram of the turntable shown in FIG. 22a;

FIG. 23c is a stereogram of the turntable shown in FIG. 23a;

FIG. 24b is a stereogram of the turntable shown in FIG. 24a;

FIG. 25b is a stereogram of the turntable shown in FIG. 25a;

DETAILED DESCRIPTION

Figure 1:
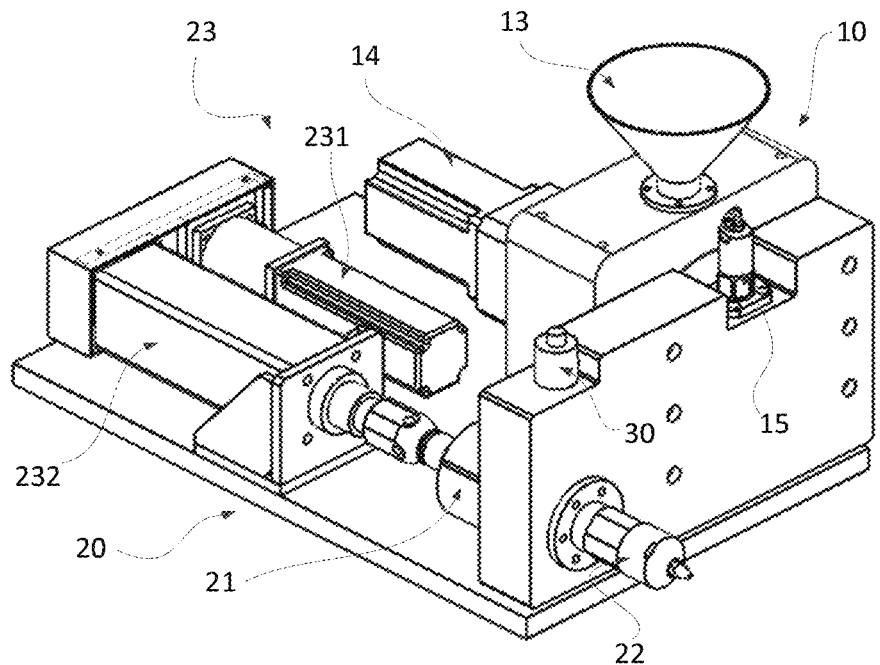
FIG. 1 is a schematic structural diagram of the glue injection apparatus provided by one embodiment of the present application.

In order to enable persons skilled in the art to better understand the technical solutions in the present application, a clear and comprehensive description of the technical solutions in the embodiments of the present application will be made below in combination with the figures in the Examples of the present application, and obviously, the embodiments described herein are only part of, rather than all of the embodiments of the present application. Based on the embodiments of the present application, all other embodiments obtained by ordinary skilled persons in the field without paying creative efforts should pertain to the extent of protection of the present invention.

It should be clearly stated that when an element is referred to as being "provided on" another element, it can be directly on the other element, or intervening elements may also exist. When an element is referred to as being "connected to" another element, it can be directly connected to the other element, or intervening elements may also exist. The terms "vertical", "horizontal", "left", "right" and similar expressions in this text are used for purpose of explanation only, and do not represent any unique embodiment.

Unless otherwise defined, all technical and scientific terms used in this text have the same meaning as commonly understood by persons skilled in the art to which the present invention belongs. The terms used in the Description of the present invention are for the purpose of describing the specific embodiments only, and are not intended to limit the present invention. The term "and/or" used in this text includes any and all combinations of one or more of the associated listed items.

This embodiment provides a low-pressure glue injection apparatus with a disc type end face and spiral grooves, which comprises an active turntable mechanism, a glue delivery tube, a plunger pump mechanism, a glue injection tube and a first heating and temperature control mechanism; the active turntable mechanism includes a shell having a feed port and a discharge port, and a rotatable turntable provided inside the shell; the discharge port is located on a rotation axis of the turntable, an end face of the turntable facing the discharge port is opened with a plurality of spiral grooves extending from a periphery to a center in form of an Archimedes spiral, and this end is in a substantially tapered shape; a feeding direction the feed port is perpendicular to a direction of the rotation axis of the turntable and pointing to these spiral grooves; an end of the glue delivery tube cuts through and connects to the discharge port; the plunger pump mechanism includes a plunger pump having a material inlet end and a material outlet end, and the other end of the glue delivery tube cuts through and connects to the material inlet end of the plunger pump; an end of the glue injection tube cuts through and connects to the material outlet end of the plunger pump; the first heating and temperature control mechanism includes a heating member capable of heating provided on at least a part of the glue injection tube, and a monitor member capable of realizing detection and feedback control of a temperature of the glue in that part of the glue injection tube; a one-way valve is provided on the glue delivery tube to prevent reverse flow of the glue; a pressure sensor is provided at a position on the glue injection tube close to the other end; the plunger pump mechanism further includes a glue injection servo motor for driving the plunger pump, and an output signal from the pressure sensor is transmitted to a control signal input end of the glue injection servo motor; the turntable is driven to rotate by a turntable servo motor; the apparatus further comprises a second heating and temperature control mechanism provided outside the active turntable mechanism and the plunger pump mechanism, the structure and working principle of the second heating and temperature control mechanism are identical to that of the first heating and temperature control mechanism, while the only difference lies in the mounting positions; the above mentioned temperature monitoring member is a customary technical means in the traditional technology, under the technical concept of the present application, persons skilled in the art are able to select the specific structure of the corresponding form, and thus no redundant description will be provided here.

In other embodiments, it is also feasible to adopt one spiral groove; or in other embodiments, other forms of spiral grooves can also be employed according to the property of the glue.

The solution of the present design includes the following main parts:

A. Plasticizing melting solution of thermoplastic material: for the apparatus of the present invention, one or more spiral grooves of Archimedes are designed on the end face of the active turntable from which the material is fed, and a depth of the spiral groove is designed to be gradually reduced from an outer circle to a circle center, so as to make it easy for the raw material to enter the spiral groove; when the servo motor drives the end face of the spiral disc to rotate, the particulate thermoplastic material is continuously pushed from the outer circle to the center of the spiral disc, and during the motion process the particulate material suffers from increasing squeezing and rubbing, thereby forming a shear heat; in order to enhance the effect of conversion from mechanical energy to heat, the present invention also designs one or more spiral grooves of Archimedes on an end face of a fixed disc corresponding to the spiral groove of the active turntable; the solid particulate material is realized to be fed and rapidly heated to become liquid hot-melt glue during the process of rotation of the active turntable, thereby realizing rapid melting and achieving the effect of melting for immediate consumption; this fundamentally solves the defective rate of the packaged electronic products and risk of blockage of the glue injection flow path resulted from aging and carbonization phenomena of the raw material caused by repeated heating and boiling under high temperature conditions.

B. Precise control of glue injection temperature: the plasticized material liquid enters a mold cavity of the plunger pump, and a heating and temperature control device designed on the plunger pump performs further heating and heat preservation to the entered material liquid, making the temperature of the material liquid uniform, thereby achieving a precise control of the temperature.

C. Precise control of the glue injection pressure: the glue injection action of the plunger pump is driven by a servo motor. An electronic pressure sensor mounted on the glue injection flow path monitors the pressure in glue injection in real time, and constantly transmits detected pressure signals to a PLC and the servo motor controller, and after comparison with a set pressure and calculation, the pressure of the glue injection is automatically adjusted to conduct a "closed-loop control", thereby realizing a precise control of the pressure of the low-pressure glue injection.

D. Free of regrind material during injection molding: the hot flow path technology is employed in the low-pressure glue injection, which does not produce any "regrind material", therefore, this greatly reduces the waste of sizing materials, lowers the costs and improves the quality and conformance rate of the packaged electronic products.

In general, a fluid with low viscosity refers to a fluid of which a stress is in direct proportion to a strain rate. For some flowing liquids, the ratio of shear stress ti to shear rate D is a constant, namely, $\eta=\tau/D$. Both water and oil are liquids that obey the above-mentioned principle. This equation is namely the Newton's Law of viscosity, wherein: $\eta$ is the viscosity of a liquid, viscosity referring to the magnitude of an internal friction or resistance of the liquid when flowing. The unit of $\eta$ is Pa·s or mPa·s (Pascal·second). Liquids that obey the Newton's Law of viscosity are called Newtonian fluids.

Any liquid of which the shear rate D and shear stress ti are not in a linear relationship when in motion is called a non-Newtonian fluid.

The feature of a non-Newtonian fluid is that: when a high polymer melt or concentrated solution is stirred in a container, due to the effect of rotational shearing, the fluid will arise along an inner cylinder wall or a shaft, thereby causing a shaft wrapping or pole climbing phenomenon. The high polymer is stirred when synthesized, when the shaft rotates in the liquid, the shear rate is greater at a location which is farther away from the shaft, thus the normal stress is greater, and correspondingly, the elastic restoring force of the high polymer chains is greater, therefore the melt is squeezed upwardly along the shaft. When the rod inserted therein rotates, the melt is not threw to the vicinity of the container wall by the inertia effect, but is around the rotating rod, and causes the "pole climbing" phenomenon that the melt climbs up along the rob. This phenomenon is called "weissenberg effect", and is also called a "shaft wrapping" phenomenon. The reason for the occurrence of such a phenomenon is that the high polymer liquid is a liquid that has elasticity. It is imaginable that when in swirling flow, the macromolecular chain that has elasticity will be oriented along a circumferential direction and be stretched and deformed, thereby generating a pressure towards the axis, which compels the liquid to climb along the rod. It can be obtained from the analysis that in all shearing flow fields with curved flow lines, the high polymer fluid element, apart from suffering from the shear stress (manifested as viscosity), also has a normal stress difference effect (manifested as elasticity).

The structural principle of the apparatus: the servo motor drives the active turntable to rotate by a planetary reducer. The raw material in the feeding hopper is delivered from an outer circumference to a circle center of the active turntable. In this process the particulate sizing material is constantly heated by heat generated by friction, and at the same time, since the depth of the spiral groove of Archimedes on the active turntable decreases constantly along a radial direction from the outer circle to the circle center, the particulate sizing material is further heated by shear heat formed by squeezing of the particulate sizing material, thus the sizing material is rapidly melted into liquid glue solution; the melted highly viscous glue solution (non-Newtonian liquid) forms the "weissenberg effect" during the rotation of the active turntable, forcing the glue solution to enter a material stocking space of the precise plunger pump from a small hole in the center of the end face of the corresponding fixed disc, thereby realizing the material feeding function. In order to prevent the glue from flowing back to the region of the active turntable during the glue injection procedure, a one-way valve is provided in the glue solution flow path of the fixed disc. When the plunger of the plunger pump is precisely driven by the servo motor, it is guaranteed that the entire glue after precise metering is injected into the mold, thereby realizing the precise glue injection; the melted glue is injected into the mold through the hot flow path provided in the machine, the glue solution is injected, pressurized and cooled, and then the whole process of the low-pressure glue injection packaging of the electronic product is finished, as such, the ultimate state of zero waste of raw material and free of regrind material is achieved.

Based on the above mentioned principle and structure, the solution of the present design has the following advantageous effects: 1. the present invention can heat and melt the sizing material rapidly, which completely eliminates the time wasted in waiting for the raw material to be melted in the glue cylinder in normal low-pressure injection productions, and thereby greatly improves the production efficiency; 2. the present invention solves the long existed problem in the low-pressure glue injection industry that the sizing material is carbonized by long time and repeated heating, which greatly influences the quality of the packaged products; 3. the present invention completely solves the problem of consistency of color aberration of the appearances of the low-pressure glue injection products; 4. the present invention breaks through the global problem that the low-pressure glue injection cannot be realized using materials with high hardness, high viscosity and high transparency; 5. control technology of equivalent amounts of melting and injection, i.e., melting as much raw material as the glue needed for the glue injection, which can reduce the waste of raw material; 6. application of hot flow path technology, which produces no regrind material during the process of product packaging by low-pressure glue injection and thus achieves the highest state of "zero waste"; 7. realization of precise glue injection of low-pressure glue injection technology; 8. compact structure, small size, and convenient arrangement on an automatic assembly line to work.

Please refer to FIGS. 1 to 4, which are schematic diagrams of the glue injection apparatus provided by two embodiments of the present application. In one embodiment, the glue injection apparatus is applied in, but not limited to, the field of low-pressure glue sealing, and it can also be used in the field of injection (or glue injection) molding, and the present application does not make any limitation to this.

In one embodiment, the glue injection apparatus comprises: a glue melting unit 10 including a rotatable turntable 11, a fixed member 12 and a feeding mechanism 13, a feed groove 111 being provided on a surface of the turntable 11 facing the fixed member 12, a raw material in the feed groove 111 being melted into glue solution when the turntable 11 rotates relative to the fixed member 12, a center of the fixed member 12 being provided with a glue outlet through-hole 122 which is in communication with the feed groove 111, and the feeding mechanism 13 being used for feeding material to the feed groove 111; and a glue injection unit 20 in communication with the glue outlet through-hole 122, the glue solution entering the glue injection unit when the turntable rotates, and the glue injection unit being capable of injecting the glue solution inside it into a mold.

In this embodiment, the glue injection apparatus can also comprise: a pressure measurement unit 30 connected to the glue injection unit 20, the pressure measurement unit 30 being used to measure a glue injection pressure in the glue injection unit 20; a control unit (not shown) connected to the pressure measurement unit 30 and the glue injection unit 20, the control unit being capable to control the glue injection unit 20 to stop injection when the glue injection pressure reaches a predetermined pressure.

To be specific, the glue injection unit can include a plunger pump 21 in communication with the feed groove 111 and a glue injection gun 22 connected to the plunger pump 21; the glue solution enters the plunger pump 21 when the turntable 11 rotates. The control unit (not shown) is connected to the pressure measurement unit 30 and the plunger pump 21; the control unit is capable of controlling the plunger pump 21 to stop injection when the glue injection pressure reaches a predetermined pressure.

The materials of the turntable 11 and the fixed member 12 can both be metal material or other materials having proper hardness, for example, both the turntable 11 and the fixed member 12 can be steel-made. The feed groove 111 extends from a periphery to a center of the turntable 11. What needs to be explained is that, the feed groove 111 is not limited to the spiral groove in the previous embodiment, instead, the feed groove 111 can extend from the periphery to the center of the turntable 11 in form of a spiral of Archimedes or an involute or a hyperbola or a cycloid, etc., wherein any form of the feed groove 111 can be selected to perform the glue melting according to situations of actual application. Meanwhile, the number of the feed groove 111 on the turntable 11 may be one, and may also be plural. A preferential selection can be made to the number and form of the feed groove 111 according to the characteristics of the sizing material and the amount of the inlet glue.

During the rotation process of the turntable 11, the particulate thermoplastic raw material is continuously pushed from the outer circle to the center of the turntable 11. The particulate raw material suffers from increasing squeezing and rubbing in the motion process, and is melted gradually into glue solution in the feed groove 111 as the temperature rises gradually, and then the glue solution enters the plunger pump 21 at a tail end of the feed groove 111 (center of the turntable 11).

In this embodiment, the control unit may be a hardware entity unit, and may also be a software program module, and obviously can also be a combination of software and hardware. For example, the control unit may be a computer, a PLC and a main control board, etc. To be specific, the control unit can control a rotational speed of the turntable 11 by way of, for example, transmitting a control instruction to a servo motor that drives the turntable 11. The control unit can include therein a judgment module for judging whether the glue injection pressure has reached a predetermined pressure and a control module for controlling whether the plunger pump 21 performs a glue injection.

This embodiment can employ an equal pressure glue injection principle; when performing glue injection, the glue injection pressure becomes greater and greater as the injection goes on, and when the glue injection pressure reaches a predetermined pressure is maintained for a period of time, it can be determined that the low-pressure glue injection packaging has been completed. Of course, said predetermined pressure needs to be tested in advance, once a certain pressure is tested to satisfy the requirements of the glue injection packaged products, the pressure is defined as the predetermine pressure for packaging the electronic products.

It can be seen that the predetermined pressure can be set according to parameters such as the type, compressive strength and packaging requirements of the electronic elements, and is not a fixed value; therefore, this embodiment does not make any limitation to the numerical value of the predetermined pressure. The value of the predetermined pressure should be set to enable complete packaging of the electronic elements and prevent the electronic elements from being destroyed by pressure. By such a setting, it is possible to prevent the electronic elements (such as PCB, PCBA) in the package from being destroyed by excessive glue injection pressure, thereby reducing occurrence of defective products.

By such a design, it is realized to allow the solid particulate raw material to be fed and be rapidly heated to become liquid hot-melt glue during the process of rotation of the active turntable 11, thereby realizing rapid melting and achieving the effect of melting for immediate consumption. Therefore, this embodiment fundamentally solves the defective rate of the packaged electronic products and risks of blockage of the glue injection flow path resulted from aging and carbonization phenomena of the raw material caused by repeated heating and boiling under the condition of high temperature.

In order to make full use of the above mentioned "weissenberg effect", a glue outlet through-hole 122 in communication with the feed groove 111 can be provided on a center of the fixed member 12, and the glue outlet through-hole 122 is in communication with the plunger pump 21. To be specific, the glue outlet through-hole 122 can be in communication with the plunger cavity 212 of the plunger pump 21 through a channel (i.e., the delivery flow path mentioned below).

In order to enhance the effect of conversion from mechanical energy to heat, a surface of the fixed member 12 facing the turntable 11 is also provided with a feed groove 111, wherein, reference can be made to the form of the feed groove 111 on the turntable 11 for the form of the feed groove 111 on the fixed member 12. However, this does not mean that the shape and structure of the feed groove 111 on the fixed member 12 are the same as that of the feed groove 111 on the turntable 11, and the two may have different forms. The feed grooves 111 on the fixed member 12 may be plural in number, and converge to the central through-hole.

By relative rotation between the turntable 11 and the fixed member 12, a shear is formed between the particles or molecules in the raw material. A groove depth of the feed grooves 111 provided on the fixed member 12 can increase gradually from a periphery to a center and finally converge at the glue outlet through-hole 122.

In order to improve the glue melting efficiency to be adapted to production, the groove depth of the feed groove 111 gradually decreases as extending from the periphery to the center of the turntable 11; and/or, the groove width of the feed groove 111 gradually decreases as extending from the periphery to the center of the turntable 11. By such a setting, it is possible to intensify the effect of actions such as squeezing, rubbing and shearing during the process of delivery of the raw material in the feed groove 111, so as to accelerate the rise of temperature of the raw material, thereby improving the glue melting efficiency.

Figure 6:
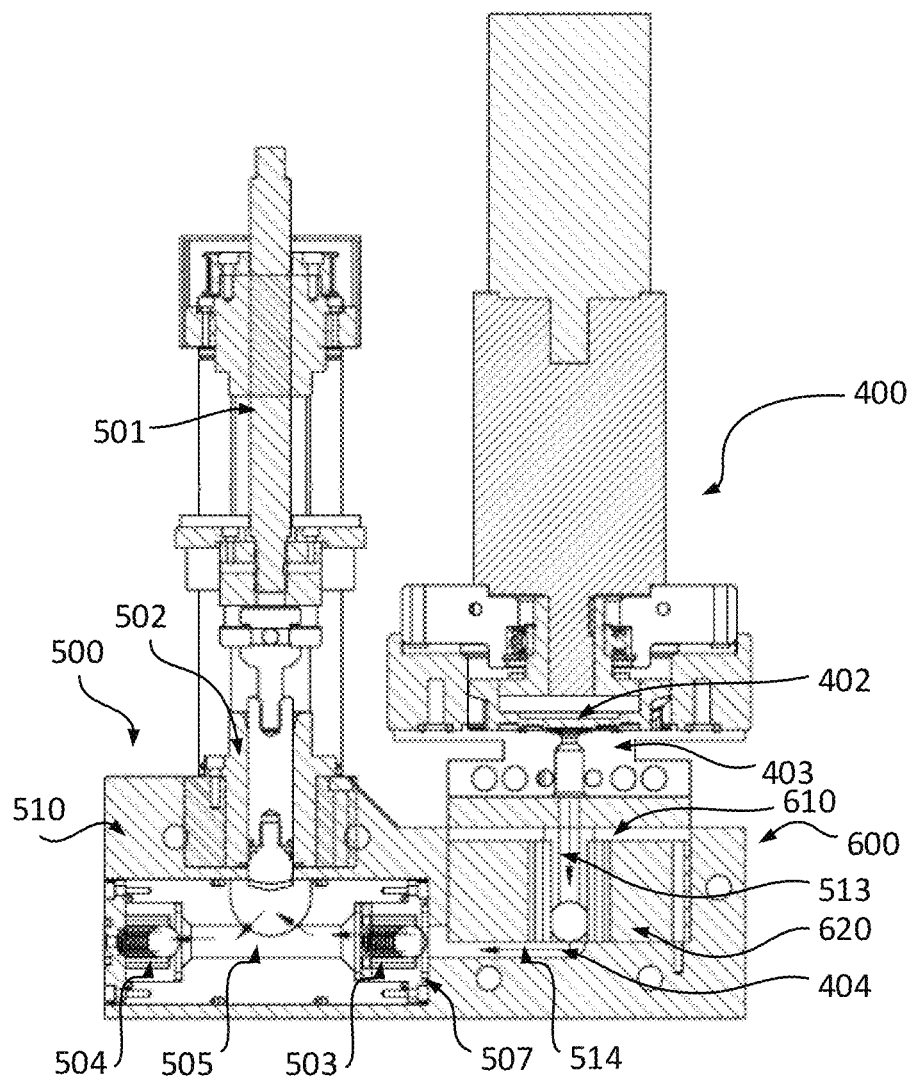
FIG. 6 is a schematic structural diagram of the glue injection apparatus provided by another embodiment of the present application.

In one embodiment, the turntable and the fixed member can be provided in a way similar to parallel setting (the opposite surfaces of them are provided parallel to each other), the turntable 11 can be placed vertically as shown in FIG. 1 (i.e., the glue melting surface is parallel to a vertical plane), and can also be placed horizontally as shown in FIG. 6 (i.e., the surface of the turntable is parallel to a horizontal plane).

To be specific, in the glue injection apparatus shown in FIG. 6, the rotational axis of the turntable 402 is parallel to the horizontal plane. For smooth glue solution outlet, as a preferred embodiment, as shown in FIG. 6, the turntable 402 is horizontally provided; the fixed member 403 can be placed beneath the turntable 402. A glue outlet through-hole is provided at a position of the fixed member 403 corresponding to a center of the turntable 402, and the glue outlet through-hole is in communication with the glue injection unit.

With continued reference to FIG. 6, the rotational axis of the turntable 402 extends in a vertical direction; the turntable 402 is located above the fixed member 403. The glue injection unit 500 has a glue solution outlet; a glue solution flow path is provided between the glue outlet through-hole and the glue solution outlet; the glue solution flow path includes a vertical flow path 513 and a horizontal flow path 514; an upper end of the vertical flow path 513 is in communication with the glue outlet through-hole; a lower end of the vertical flow path 513 is in communication with the horizontal flow path 514. Further, the vertical flow path 513 and the glue outlet through-hole extend along a vertical straight line; the horizontal flow path 514 extends along a horizontal straight line.

Figure 3:
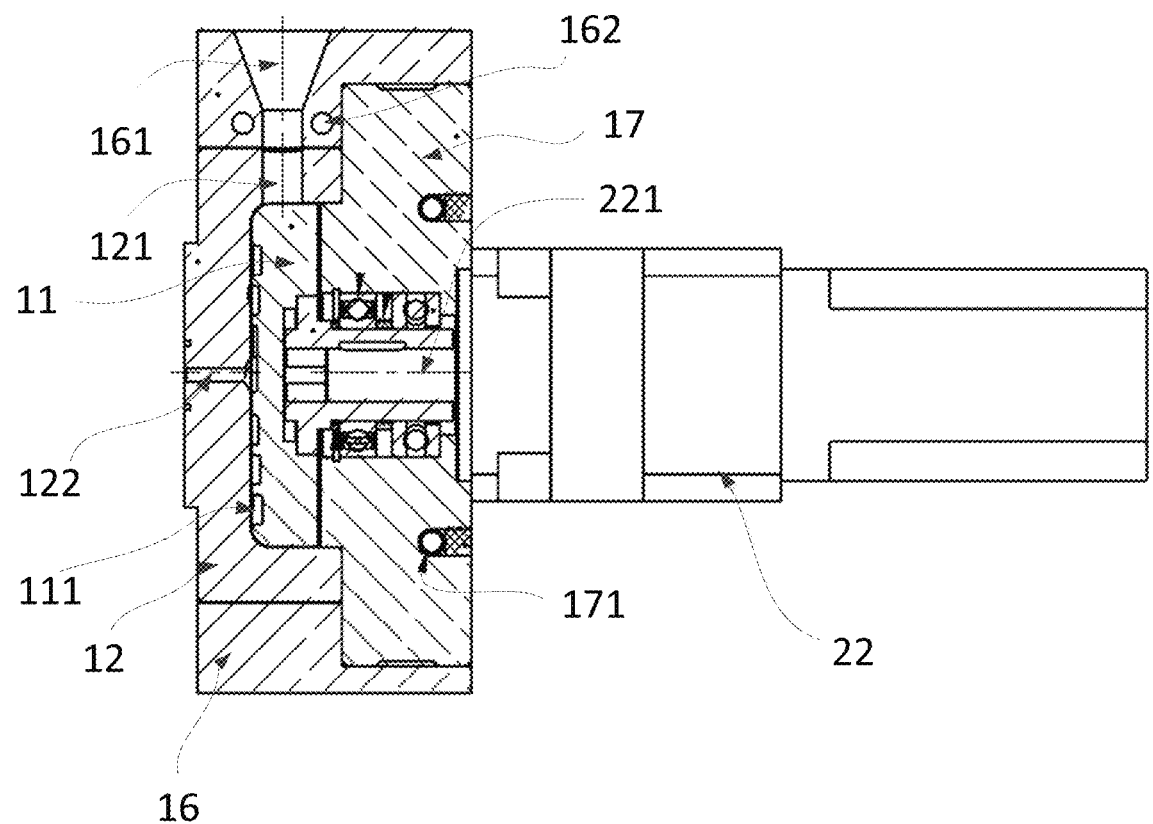
FIG. 3 is a section view of the glue melting unit in FIG. 2.

In one embodiment, as shown in FIG. 3, the glue melting unit 10 may also include a shell and a support member 17. The shell 16 is provided with a receiving through-hole that receives the fixed member 12 and the support member 17 along an axial direction of the turntable 11. A surface of the fixed member 12 facing the turntable 11 forms a recess along the axial direction of the turntable 11. The fixed member 12 is connected to the support member 17 and clamps the turntable 11 within the recess. A wall of the recess (wall of the fixed member 12) is provided with a first feeding through-hole 121, and a wall of the shell 16 is provided with a second feeding through-hole 161 which is in communication with the first feeding through-hole 121. The feeding mechanism 13 includes a feeding hopper in communication with the second feeding through-hole 161.

The glue melting unit 10 also includes a first servo motor 22. A rotational axis 221 of the first servo motor 22 is connected to the turntable 11 through the support member 17; the first servo motor 22 is connected to the control unit which is capable of controlling the first servo motor 22 to stop rotating when the glue melting unit 10 produces a predetermined amount of glue solution.

In order to ensure rotation of the turntable 11, a speed reducer, such as a planetary reducer, can also be provided between the first servo motor 22 and the turntable 11. Of course, the first servo motor 22 may also not be a component of the glue injection apparatus itself, for example, an assembly or connection portion may be reserved on the glue injection apparatus of this embodiment to facilitate an external connection of the first servo motor 22 by an operator subsequently.

In order to prevent the raw material from melted by heating at the entrance of the feed groove 111 thereby leading to situations that the raw material is obstructed from entering the feed groove 111, a first cooling tube 162 can be provided on the shell 16, into which water can be inlet to cool the shell 16. Normal temperature water (cool water) is constantly fed into the first cooling tube 162 to dissipate heat on the shell 16, thus avoiding the raw material from melted before entering into the feed groove 111 thereby blocking the entrance of the feed groove 111.

Figure 2:
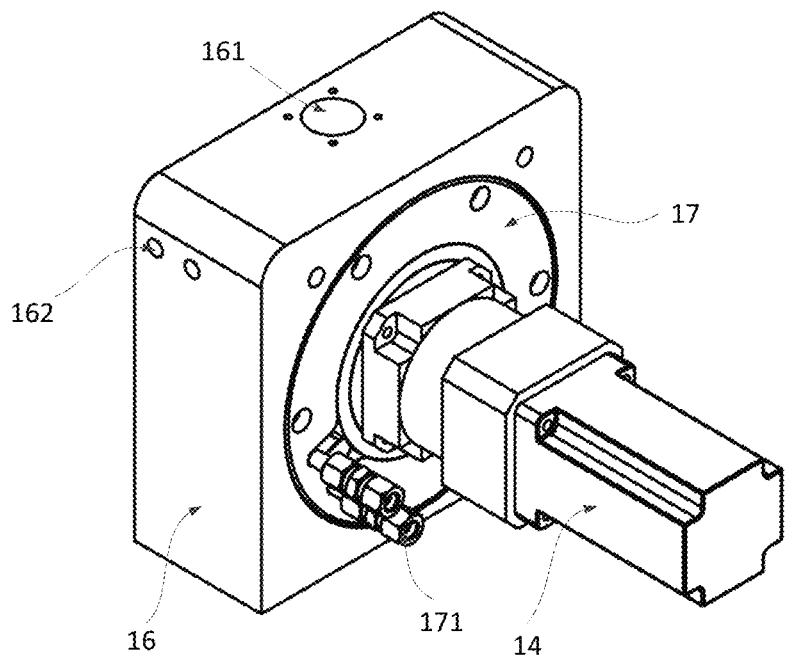
FIG. 2 is a schematic structural diagram of the glue melting unit in FIG. 1.

It can be seen from FIG. 2 and FIG. 3 that the first servo motor 22 will contact the support member 17 and is connected to the turntable 11 by the rotational axis 221, and the temperature of the support member 17 will also arise since it contacts the turntable 11. In order to prevent the first servo motor 22 from being destroyed due to the contact with high temperature, the support member 17 can be provided with a second cooling tube 171, into which water can be inlet to cool the support member 17. As shown in FIG. 2, an inlet and an outlet of the second cooling tube 171 are provided on a surface of the support member 17 close to the first servo motor 22.

The glue injection unit 20 can also include a servo electric cylinder 23 connected to the plunger pump 21. The control unit is connected to the servo electric cylinder 23; the control unit is capable of stopping the servo electric cylinder 23 when the glue injection pressure reaches a predetermined pressure, thereby controlling the plunger pump 21 to stop injection.

The servo electric cylinder 23 can include a second servo motor 231 and a lead screw mechanism 232, the lead screw mechanism 232 can convert the rotation of the second servo motor 231 into linear motion, and the lead screw mechanism 232 can be connected to the above-mentioned plunger pump 21 to thereby drive a plunger rod 211 in the plunger pump 21 to move.

In this embodiment, it is possible to set a parameter (to set a torque), i.e., a pushing force needed by the plunger pump 21 in glue injection, in advance under a "torque mode" of the second servo motor 231, and then convert it into the glue injection pressure. According to the sizes and shapes of different packaged products, the range of the predetermined pressure of the low-pressure glue injection can be from 0.05 Mpa to 6 Mpa.

In this embodiment, the glue injection apparatus can also include a temperature control unit (not shown) which is connected to the glue melting unit 10 and the glue injection unit 20; the temperature control unit can maintain the glue solution at a preset temperature. The temperature control unit can include a first heating mechanism and a first temperature sensor; the first heating mechanism and the first temperature sensor are connected to the fixed member 12; the first heating mechanism and the first temperature sensor are connected to the control unit; the control unit can control the first heating mechanism to heat the fixed member 12 to the preset temperature according to the temperature detected by the first temperature sensor.

Under the effect of the first heating mechanism, the fixed member 12 is heated to the preset temperature. Under the combined action of heating of the first preset temperature and squeezing, rubbing and shearing between the turntable 11 and fixed member 12, it is possible to realize fast melting of the raw material and achieve the effect of melting for immediate consumption, so as to be better adapted to production line works. Preferably, in order to realize a better effect of heat transfer and heating, the material of the fixed member 12 can be aluminum alloy.

Of course, in reality, the preset temperature can be set according to parameters such as type and liquid temperature of the glue solution, and does not have a relatively fixed value. In reality, the magnitude of the preset temperature should be set to prevent temperature drop or carbonization of the glue solution, so as to maintain the best quality of the glue solution.

It can be seen that by setting the first heating mechanism the glue melting speed and quality can be further improved, thereby making the glue solution reach the preset temperature rapidly. By setting the first temperature sensor, it is possible to effectively monitor whether or not the heated temperature is too high or too low, so as to facilitate the performance of PID control.

Figure 4:
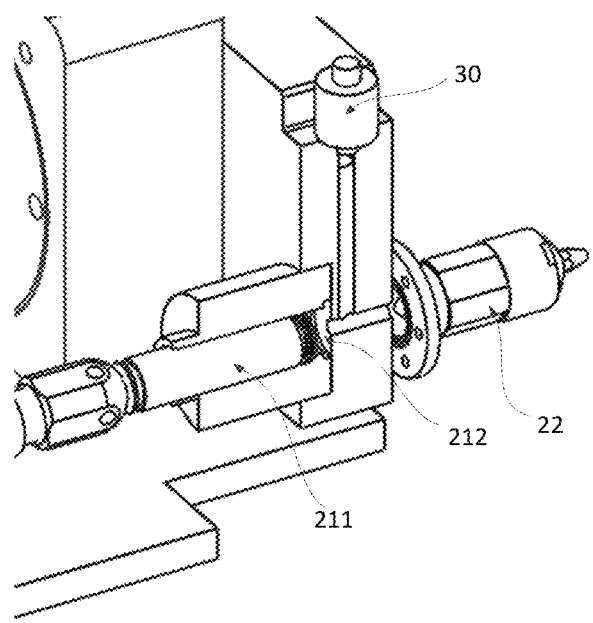
FIG. 4 is a schematic diagram of the communication between the plunger pump and the glue injecting gun in FIG. 1.

Please refer to FIG. 4. In this embodiment, the plunger pump 21 can include a plunger cavity 212 and a plunger rod 211. The plunger rod 211 can move up and down within the plunger cavity 212. A delivery flow path (such as the glue delivery tube mentioned above) is provided between the glue outlet through-hole 122 and the plunger cavity 212.

In order to avoid problems such as color aberration caused by temperature drop of the glue solution after flowing out from the glue outlet through-hole 122, the temperature control unit can also be set as follows.

The temperature control unit can also include a second heating mechanism and a second temperature sensor. The second heating mechanism and the second temperature sensor are connected to the delivery flow path. The second heating mechanism and the second temperature sensor are connected to the control unit; the control unit is capable of controlling the second heating mechanism to heat thereby raising the temperature in the delivery flow path to the preset temperature according to the temperature detected by the second temperature sensor.

The temperature control unit can also include a third heating mechanism and a third temperature sensor. The third heating mechanism and the third temperature sensor are connected to the plunger pump 21. The third heating mechanism and the third temperature sensor are connected to the control unit. The control unit can control the third heating mechanism to heat thereby raising the temperature in the plunger pump 21 (or plunger cavity 212) to the preset temperature according to the temperature detected by the third temperature sensor.

The temperature control unit can also include a fourth heating mechanism and a fourth temperature sensor. The fourth heating mechanism and the fourth temperature sensor are connected to the glue injection gun 22. The fourth heating mechanism and the fourth temperature sensor are connected to the control unit; the control unit can control the fourth heating mechanism to heat thereby raising the temperature in the glue injection gun 22 to the preset temperature according to the temperature detected by the fourth temperature sensor.

By such a setting, during the glue injection, the glue injection gun 22 can be stretched into the mold and inject glue at a position close to an electronic element. Since the delivery flow path 400 and the glue injection gun 22 are both "hot flow paths", the length of a "cold flow path" between the glue injection gun 22 and the electronic element can be shortened as far as possible. Therefore, no "regrind material" is produced as the hot flow path technology is employed in the low-pressure glue injection, which greatly reduces the waste of sizing material, lowers the costs, and improves the quality and conformance rate of the packaged electronic products.

Of course, as a preferred solution, the temperature control unit can include at the same time the first heating mechanism and the first temperature sensor, the second heating mechanism and the second temperature sensor, the third heating mechanism and the third temperature sensor, the fourth heating mechanism and the fourth temperature sensor, wherein, the heating mechanisms can be heating tubes or heating rods or resistance wires or PTC heating elements, etc.

In order to prevent the glue solution from flowing back, a one-way valve 15 can be provided in the delivery flow path. The pressure measurement unit 30 includes a pressure sensor provided downstream of the one-way valve 15, wherein, the pressure sensor is connected to the control unit. Preferably, as shown in FIG. 4, the pressure sensor is provided between the plunger pump 21 and the glue injection gun 22, wherein, an outlet and an inlet of the plunger pump 21 can be a same opening, a tail end of the delivery flow path can be opened between the plunger pump 21 and the glue injection gun 22, and thus it is possible, by means of the one-way valve 15, to turn the glue solution to enter the plunger pump from the glue melting unit 10, or to enter the mold from the plunger pump. The one-way valve 15 can be a pneumatic one-way valve 15, of which the opening pressure is adjustable.

Figure 5:
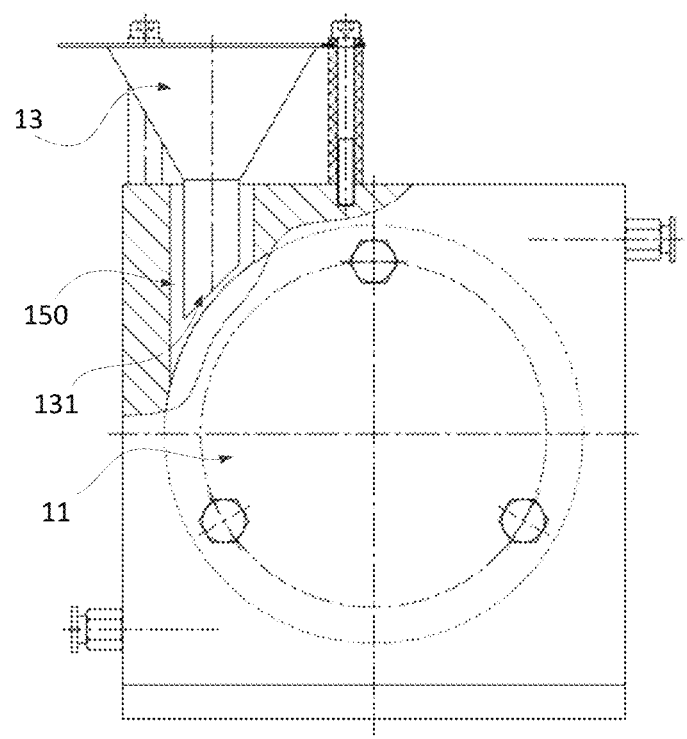
FIG. 5 is a section view of the glue melting unit in FIG. 1.

Please refer to FIG. 5. The feeding mechanism 13 has a material outlet port 131 for feeding materials to the feed groove 111, and a gap 150 is provided between the part of the feeding hopper that stretches into the first feeding through-hole and the second feeding through-hole and the walls of the first feeding through-hole and the second feeding through-hole. The gap 150 can form an annular air cooling sleeve, which avoids a "bridging phenomenon" (the bridging phenomenon refers to that the material forms a bulk and sticks at the material inlet port after being melted by heating) of the material caused by transferring of heat on the turntable to the feeding channel (the material outlet port 131 is the tail end port of the feeding channel) inside the feeding mechanism, thereby ensuring the material to enter the feed groove 111 of the turntable smoothly.

To be specific, the feeding mechanism 13 can include a feeding hopper 13. An upper portion of the feeding hopper is a tapered part (which can be conical shaped, and can also be pyramidal shaped) for feeding materials. A lower portion (or can be referred to as a neck) thereof is a cylindrical cartridge, and the material outlet port 131 is just located at a tail end (lower end) of the cylindrical cartridge. In reality, the tail end of the feeding hopper can feed materials to the feed groove 111 of the turntable through the first feeding through-hole 121 and the second feeding through-hole 161.

As shown in the figure, the material outlet port 131 can be located at the tail end of the feeding hopper. The material outlet port 131 faces an outer circumferential face of the turntable. In general, the material outlet port 131 faces the outer circumferential face of the turntable along a lengthwise direction of the feeding hopper (the feed groove 111 is formed with a feed port on the outer circumferential face, and the material enters the feed groove 111 from the feed port when the feed port is rotated to face the material outlet port 131), and the feeding hopper is generally placed vertically, therefore, the material outlet port 131 can face the outer circumferential face of the turntable substantially in an up-to-down direction.

The feed port of the feed groove 111 is formed on the outer circumferential face of the turntable. The gap 150 is provided between the cylindrical cartridge portion of the feeding hopper and an outer circumferential face of the shell. The gap 150 can prevent the material outlet port 131 from being too close to the turntable, which allows the material at the material outlet port 131 to be melted by heat on the turntable thereby generating the bridging phenomenon.

The gap 150 can space the cylindrical cartridge portion of the feeding hopper from the walls of the shell and the fixed member with a preset distance, and the preset distance is just the width of the gap 150. The width of the gap 150 can be determined according to actual situations, for example, the corresponding width of the gap 150 can be set according to different temperatures of the turntable as the temperatures set for different materials are different. Alternatively, the width of the gap 150 can be 2 to 10 millimeters.

In order to guarantee sufficient and smooth material feeding, the tail end of the feeding hopper can be opened with an inclined opening (the inclined opening may also be a plane opening, and may also be an arc opening, and the present application does not make any limitation to this) to form the material outlet port 131. A tilt direction of the material outlet port 131 may form an angle other than 90 degrees with a lengthwise direction of the feeding hopper. To be specific, as shown in FIG. 5, the tilt direction of the inclined opening is substantially parallel to a tangential direction of the part of the turntable to which it faces.

The part of the outer circumferential face of the turntable to which the material outlet port 131 faces is located between a top portion and a central edge portion of the outer circumferential face of the turntable, namely, an angle between the horizontal plane and a connection line between the part of the outer circumferential face of the turntable to which the material outlet port 131 faces and the rotational axis is less than 90 degrees and greater than 0 degree. Preferably, the angle between the horizontal plane and a connection line between the part of the outer circumferential face of the turntable to which the material outlet port 131 faces and the rotational axis is about 45 degrees.

In order to form a gap 150 between the material outlet port 131 of the feeding hopper and the turntable, the feeding hopper is held above the turntable. As shown in FIG. 5, a support frame for holding the feeding hopper is provided on the shell.

In order to further improve the smoothness of the material feeding and avoid the "bridging phenomenon" of the material, the low-pressure glue injection apparatus of this embodiment can also include an electric field application mechanism; the electric field application mechanism can apply an alternating non-uniform electric field to the feeding mechanism 13. By such a setting, the material in the feeding mechanism 13 can be in an alternating non-uniform electric field, thus can suffer from the combined action of centrifugal force, repulsive force and particle gravity, thereby particles of the material will keep vibrating steadily in the hopper and formation of the "bridging phenomenon" is avoided.

Alternatively, the electric field application mechanism (not shown) can be provided by an electrode group. In the electrode group of an electric curtain, the electrodes are in spaced connection to one another. When applying a single phase alternating current, an alternating non-uniform electric field array can be formed in the electrode group. In the alternating non-uniform electric field, particles can suffer from the combined action of centrifugal force, repulsive force and particle gravity, thus the particles of the material will keep vibrating steadily in the hopper, thereby effectively avoiding the "bridging phenomenon" of the material. When the feed port on the turntable rotates to the material outlet port 131 of the feeding hopper, the power supply is switched off, and a vertical blanking is performed under the force of gravity.

Figure 7:
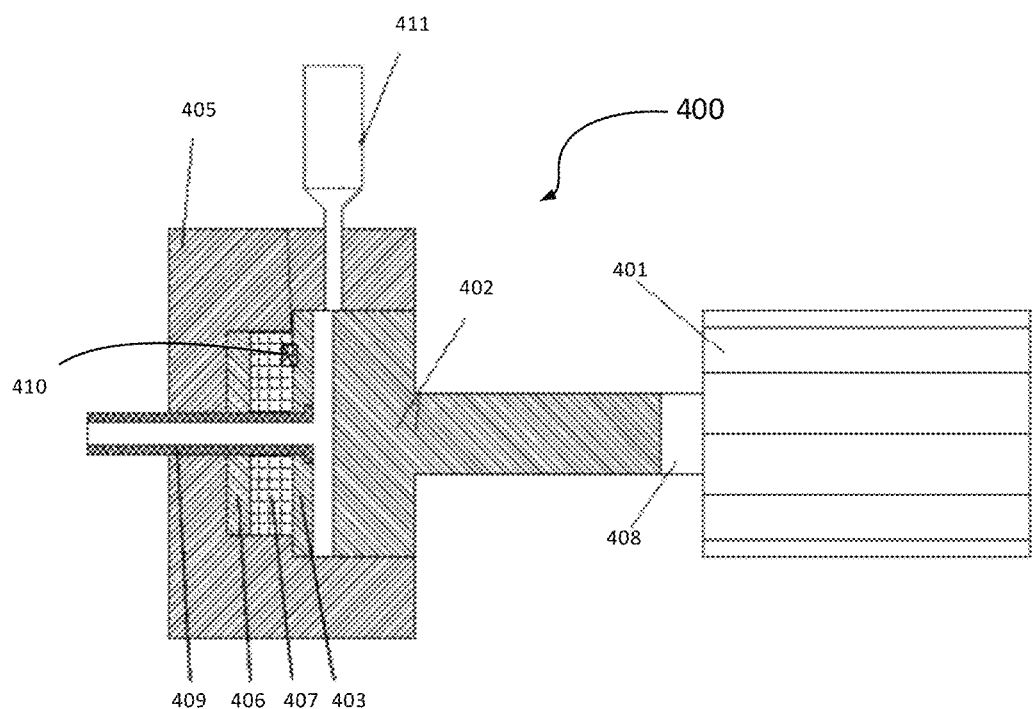
FIG. 7 is a schematic structural diagram of the glue melting unit in the glue injection apparatus in FIG. 6.
Figure 8:
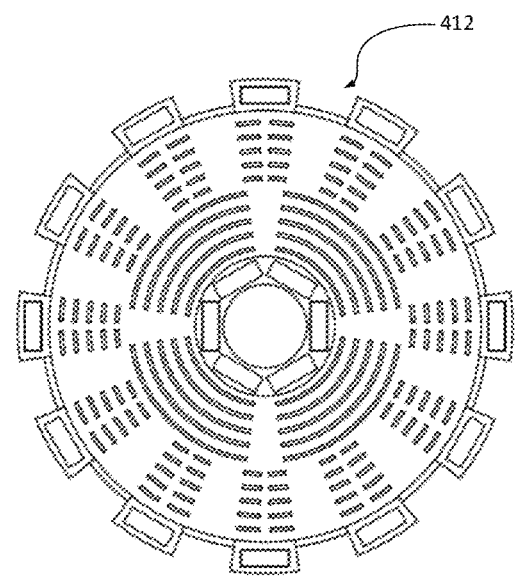
FIG. 8 is a schematic structural diagram of the electromagnetic coil panel provided by one embodiment of the present application.

Please refer to FIGS. 6 to 8 which are schematic diagrams of the glue injection apparatus provided by another embodiment of the present application. In this embodiment, the glue injection apparatus is applied in, but not limited to, the field of low-pressure glue sealing, and it can also be used in the field of injection (or glue injection) molding, and the present application does not make any limitation to this.

In this embodiment, the glue injection apparatus comprises: a glue melting unit 400 including a rotatable turntable 402 and a fixed member 403, a feed groove being provided on a surface of the turntable 402 facing the fixed member 403, a raw material in the feed groove being melted into glue solution when the turntable 402 rotates relative to the fixed member 403; an electromagnetic heating unit 406 capable of heating the fixed member 403 by electromagnetic induction; a glue injection unit 500 in communication with the glue melting unit 400, the glue solution entering the glue injection unit 500 when the turntable 402 rotates, and the glue injection unit 500 being capable of injecting the glue solution inside it into a mold.

The materials of the turntable 402 and the fixed member 403 can both be metal material or other materials having proper hardness, for example, both the turntable 402 and the fixed member 403 can be steel-made. In order to ensure that the fixed member 403 can be heated by the electromagnetic heating unit 406, the material of the fixed member 403 can be a ferrous metal. A surface of the turntable 402 which faces the fixed member 403 or which is provided with the feed groove is preferably in a circular shape, correspondingly, a surface of the fixed member 403 facing the turntable 402 is also preferably in a circular shape. Overall, the entirety of the turntable 402 can be configured as a disc.

The feed groove extends from a periphery to a center of the turntable 402. What needs to be explained is that, the feed groove is not limited to the spiral groove in the previous embodiment, instead, the feed groove can extend from the periphery to the center of the turntable in form of a spiral of Archimedes or an involute or a hyperbola or a cycloid, etc., wherein any form of the feed groove can be selected to perform glue melting according to situations of practical application. Meanwhile, the number of the feed groove on the turntable 402 may be one, and may also be plural. A preferential selection can be made to the number and form of the feed groove according to the characteristic of the sizing material and the amount of the inlet glue.

In this embodiment, during the rotation process of the turntable 402, a particulate raw material (of course, the raw material may also be thread like or powder like) enters the feed groove. The thermoplastic raw material is continuously pushed from the outer circle to the center of the turntable 402. The particulate raw material suffers from increasing squeezing and rubbing in the motion process, and is melted gradually into glue solution in the feed groove as the temperature rises gradually, and then the glue solution enters the glue injection unit 500 at a tail end of the feed groove (the center of the turntable 402).

By such a design, it is realized to allow the solid particulate raw material to be fed and be rapidly heated to become liquid hot-melt glue during the process of rotation of the turntable 402, thereby realizing rapid melting and achieving the effect of melting for immediate consumption. Therefore, this embodiment fundamentally solves the defective rate of the electronic products and risk of blockage of the glue injection flow path 404 resulted from aging and carbonization phenomena of the raw material caused by repeated heating and boiling under the condition of high temperature.

In order to make full use of the above mentioned "weissenberg effect", a glue outlet through-hole in communication with the feed groove can be provided on a center the fixed member 403, and the glue outlet through-hole is in communication with the glue injection unit 500 to input the glue solution into the glue injection unit 500.

To be specific, the glue injection unit 500 may include a plunger pump 502 which is provided with a plunger cavity and a plunger rod. The glue outlet through-hole can be in communication with the plunger cavity of the plunger pump 502 through a channel (namely, the delivery flow path 404 mentioned below).

In order to enhance the effect of conversion from mechanical energy to heat, the surface of the fixed member 403 facing the turntable 402 can also be provided with a feed groove, wherein, reference can be made to the form of the feed groove on the turntable 402 for the form of the feed groove on the fixed member 403. However, this does not mean that the shape and construction of the feed groove on the fixed member 403 are the same as that of the feed groove on the turntable 402, and the two may have different forms. The feed grooves on the fixed member 403 may be plural in number, and converge at the central through-hole.

By relative rotation between the turntable 402 and the fixed member 403, a shear is formed between the particles or molecules in the raw material. In order to make full use of the above mentioned "weissenberg effect", a groove depth of the feed groove provided on the fixed member 403 may increase gradually from a periphery to a center and finally converges at the glue outlet through-hole.

In order to improve the glue melting efficiency to be adapted to the production, the groove depth decreases gradually when extending from the periphery to the center of the turntable 402; and/or, a groove width of the feed groove decreases gradually when extending from the periphery to the center of the turntable 402. By such a setting, it is possible to intensify the effect of actions such as squeezing, rubbing and shearing during the process of delivery of the raw material in the feed groove, so as to accelerate the rise of temperature of the raw material, thereby improving the glue melting efficiency.

At present, the traditional injection molding machine performs heating by using a resistance heat conduction method, which has a lot of unconquerable problems in practical applications, such as: 1. low heat utilization rate: when heating with the resistance heat conduction, the thermal conversion efficiency of the resistance coil is only 35%, while 65% of the heat dissipates into the ambient environment, resulting in serious energy waste; 2. severe thermal pollution: the heat loss dissipated into the ambient environment causes thermal pollutions to the environment and greatly reduces the service life of the injection machine, and an electric fan is needed for the heat dissipation, which increases production costs for enterprises and lowers the security of the device; 3. the resistance heater is vulnerable: the resistance heater is likely to age and burn out due to long term uses under high temperature, the service life is short, and the amount of maintenance is large.

As shown in FIG. 7, in consideration of the above-mentioned problem, this embodiment heats the fixed member 403 by using the electromagnetic heating unit 406 which is capable of heating the fixed member 403 by electromagnetic induction. The fixed member 403 receives electromagnetic inductions and produces heat within itself, while there is little influence on the temperature of the electromagnetic heating unit 406 itself, hence the electromagnetic heating unit 406 can maintain a relatively low temperature and suffer from small amount of electric losses. Therefore, even if the power is large, the service life of the electromagnetic heating unit 406 will not be influenced.

Considering that the glue melting is performed by relative rotation of the turntable 402 facing the fixed member 403, the electromagnetic heating unit 406 can be provided at a side of the fixed member 403 that faces away from the turntable 402. It can be seen that the fixed member 403 can be provided between the electromagnetic heating unit 406 and the turntable 402.

In order to better ensure the thermal efficiency of the electromagnetic heating unit 406 and prevent thermal losses caused by heat dissipation of the fixed member 403, as a preferred technical solution, a heat preservation material 407 is provided between the electromagnetic heating unit 406 and the fixed member 403. To be specific, the heat preservation material 407 includes a high-temperature glass wool, an aluminum silicate heat preservation material or a gel heat preservation material.

By setting a layer of heat preservation material 407 between the electromagnetic heating unit 406 and the fixed member 403, and owing to the heat preservation material 407, most heat of the fixed member 403 is absorbed by the material in the glue melting cavity (a gap between the fixed member 403 and the turntable 402), thereby the thermal efficiency is improved significantly, and 20%-60% of the electric energy can be saved compared to the traditional resistance heating method.

As shown in FIG. 6, the glue outlet through-hole is connected with a glue solution outlet channel. The electromagnetic heating unit 406 includes electromagnetic coils (also referred to as induction coils) that surround in a circumferential direction of the glue solution outlet channel, wherein, an end of the glue solution outlet channel may be provided in the glue outlet through-hole, and may also be connected at an end of the glue outlet through-hole. The electromagnetic coils can be arranged in a plurality of shapes, for example, they can be configured as a plurality of concentric circles, and can also be configured as a plurality of independent circles, and the present application does not make any limitations to this.

In this embodiment, the electromagnetic coils may be formed into a disc shape or a cylindrical shape. Preferably, as shown in FIG. 8, the electromagnetic coils can be machined into an electromagnetic coil panel 412, and thus the fixed member 403 is located between the electromagnetic coil panel 412 and the turntable 402.

Since heat is generated only in an interior of the metal of the fixed member 403 during the electromagnetic induction heating, while the electromagnetic coils themselves have a low temperature and small electrical loss, therefore, even if the power is large, the service life of the heating system is not influenced. In addition, apart from the glue injection cavity, the surface temperatures are below 50° C., thereby avoiding occurrences of accidents of burns and scalds caused by the surface temperatures.

The glue injection apparatus may also include a temperature control system. The temperature control system can include a temperature sensor 410 capable of acquiring a heating temperature of the electromagnetic heating unit 406 and a control unit (not shown). The control unit is connected to the temperature sensor 410 and the electromagnetic heating unit 406, and controls the heating temperature to be maintained at a preset temperature according to a temperature detected by the temperature sensor 410. In order to better reflect the heating effect of the fixed member 403, the temperature sensor 410 is preferably provided on the fixed member 403.

Under the effect of the electromagnetic heating unit 406, the fixed member 403 is heated to the preset temperature. Under the combined action of heating at the preset temperature and the squeezing, rubbing and shearing between the turntable 402 and fixed member 403, it is possible to realize fast melting of the raw material and achieve the effect of melting for immediate consumption, so as to be better adapted to the production line work.

Of course, in reality, the preset temperature can be set according to parameters such as type and liquid temperature of the glue solution, and does not have a relative fixed value. In reality, the magnitude of the preset temperature shall be set to prevent temperature drop or carbonization of the glue solution, so as to maintain the best quality of the glue solution.

It can be seen that by setting the electromagnetic heating unit 406 the glue melting speed and quality can be further improved, thereby making the glue solution reach the preset temperature rapidly. By setting the temperature sensor 410, it is possible to effectively monitor whether or not the heated temperature is too high or too low, so as to facilitate the performance of PID control.

Meanwhile, the use of high frequency heating system saves the energy radiated to the air when using the traditional heating method. Moreover, since the electromagnetic coils are separated from the fixed member 403, the influence of the rising temperature of the heating system to the electromagnetic control system is avoided.

In this embodiment, the temperature control system may also include a rectifying circuit and an inverter circuit. The rectifying circuit can convert the mains into 300 volts to 400 volts of direct current. The inverter circuit can convert the direct current output from the rectifying circuit into 20 kHz to 40 kHz of alternating current.

In this embodiment, a fast changing alternating magnetic field is generated by a fast changing high-frequency and high-voltage current with a voltage of 300-400V and a frequency of 20-40 kHz flowing through the electromagnetic coils, when the magnetic line of force within the magnetic field passes through the magnetic guide metal in the fixed member 403, it will generate countless small eddy currents in the metal, causing the molecules and atoms of the metal material itself to rub severely and irregularly to generate heat with a high speed, thereby heating the material in the glue melting cavity rapidly and effectively.

In this embodiment, the glue melting unit 400 may also include a shell 405 and a first servo motor 401. The shell 405 is provided with, in an axial direction of the turntable 402, a receiving groove that receives the fixed member 403, the turntable 402 and the electromagnetic heating unit 406. The first servo motor 401 drives the turntable 402 to rotate. The feed groove is provided with a material inlet port on a side wall of the turntable 402, and a feeding through-hole in communication with the material inlet port is provided on a wall of the shell 405. The fixed member 403 is located between the electromagnetic heating unit 406 and the turntable 402.

A rotational axis 408 of the first servo motor 401 is connected to the turntable 402; the first servo motor 401 can be connected to a first control unit which is capable of controlling the first servo motor 401 to stop rotating when the glue melting unit 400 prepares a predetermined amount of glue solution.

In order to ensure rotation of the turntable 402, a speed reducing mechanism, such as a planetary reducer, can be provided between the first servo motor 401 and the turntable 402. Of course, the first servo motor 401 may not be a component of the glue injection apparatus itself, for example, an assembly or connection portion may be reserved on the glue injection apparatus of this embodiment to facilitate an external connection of the first servo motor 401 by an operator subsequently.

As shown in FIG. 7, a feeding mechanism can be provided on the shell 405, which feeding mechanism can feed materials to the feed groove through the feeding through-hole. To be specific, the feeding mechanism includes a feeding hopper 411 in communication with the feeding through-hole. A bottom of the shell 405 is provided with a thru hole for passage of the glue solution outlet channel therethrough, while the thru hole and the receiving groove run through the shell 405 together.

Another embodiment of the present application also provides a low-pressure glue sealing system for electronic elements, comprising: a mold (not shown) having a mold cavity which can receive the element to be sealed with glue and a glue inlet port opened into the mold cavity; a low-pressure glue injection apparatus according to any of the above mentioned embodiments, of which a glue injection gun injects glue into the mold cavity through the glue inlet port.

Figure 9:
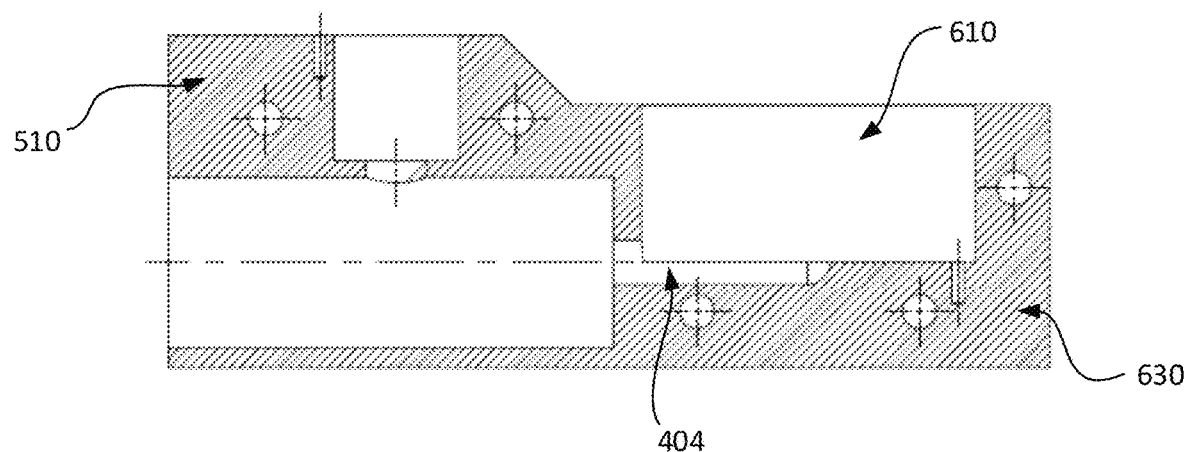
FIG. 9 is a schematic diagram of the shell of the temperature equalization unit in FIG. 6.
Figure 10A:
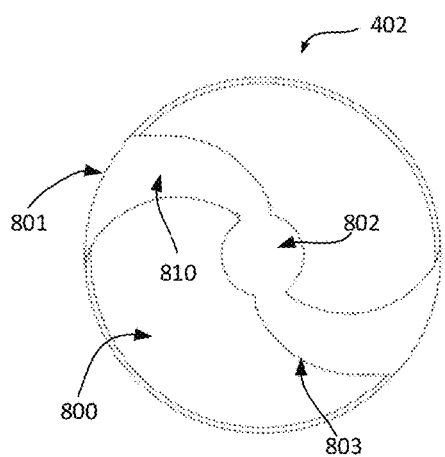
FIG. 10a is a schematic diagram of the turntable provided by one embodiment of the present application.
Figure 10B:
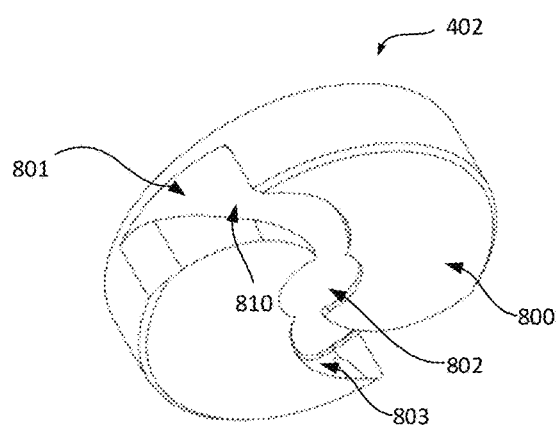
Figure 11A:
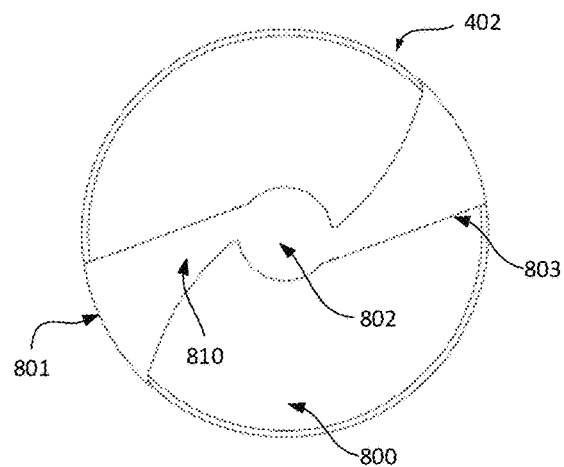
FIG. 11a is a schematic diagram of the turntable provided by another embodiment of the present application.
Figure 11B:
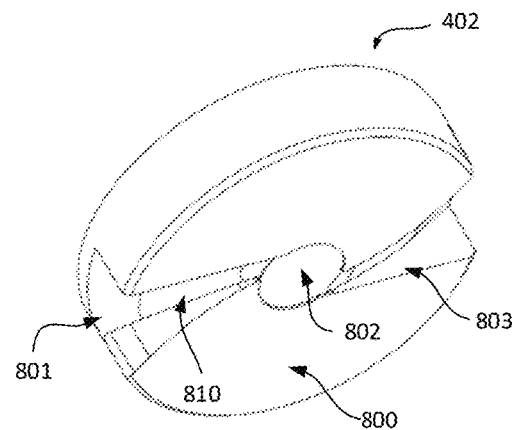
Figure 12A:
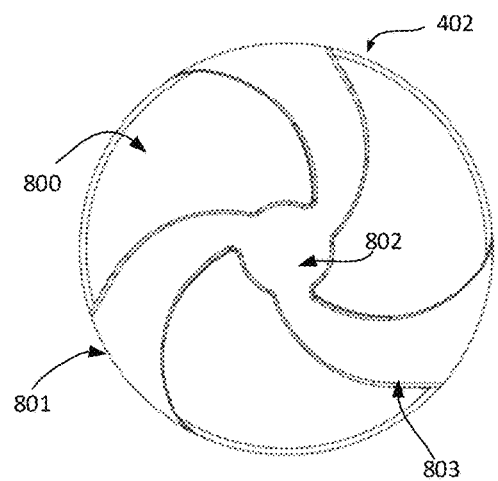
FIG. 12a is a schematic diagram of the turntable provided by another embodiment of the present application.
Figure 12B:
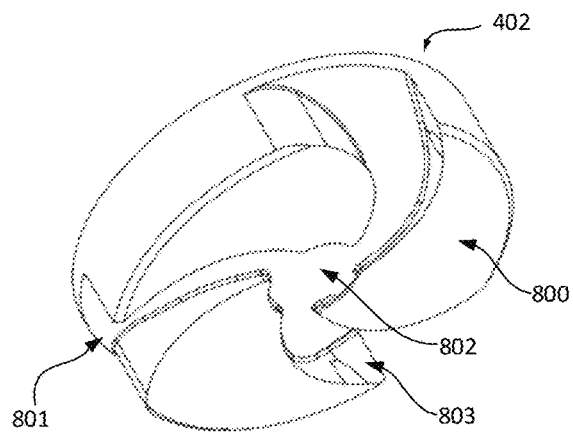
Figure 13A:
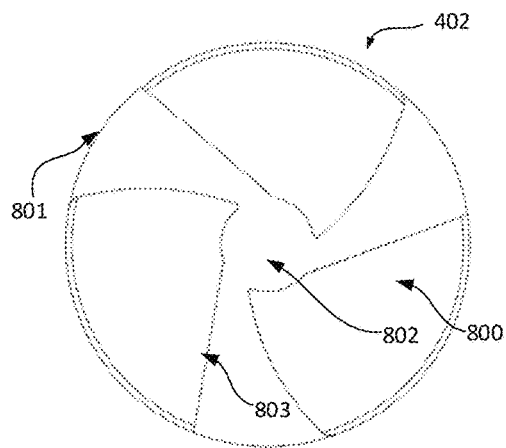
FIG. 13a is a schematic diagram of the turntable provided by another embodiment of the present application.
Figure 13B:
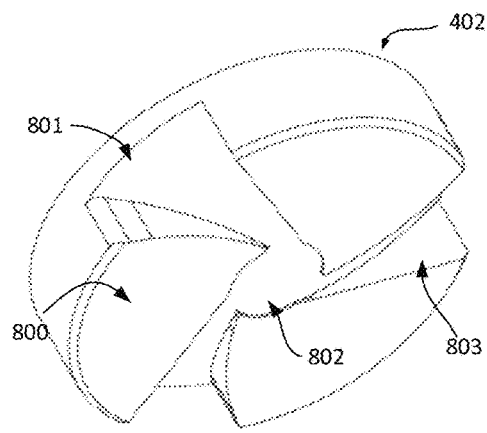
Figure 14A:
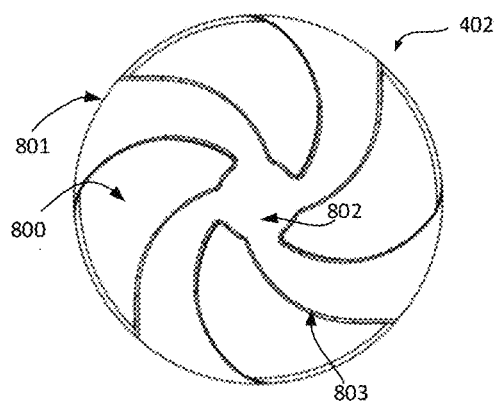
FIG. 14a is a schematic diagram of the turntable provided by another embodiment of the present application.
Figure 14B:
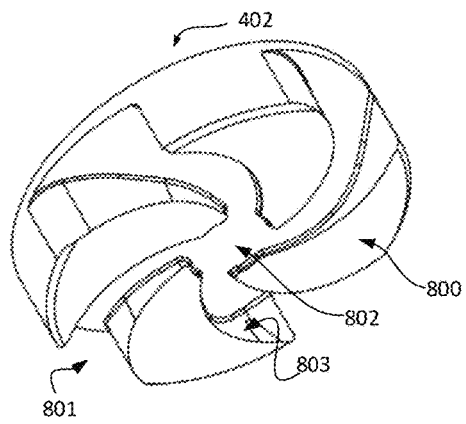
Figure 15A:
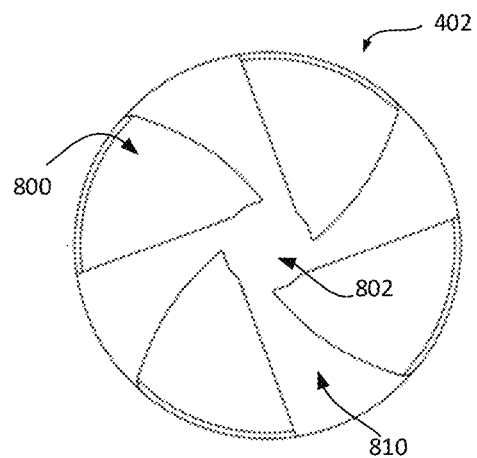
FIG. 15a is a schematic diagram of the turntable provided by another embodiment of the present application.
Figure 15B:
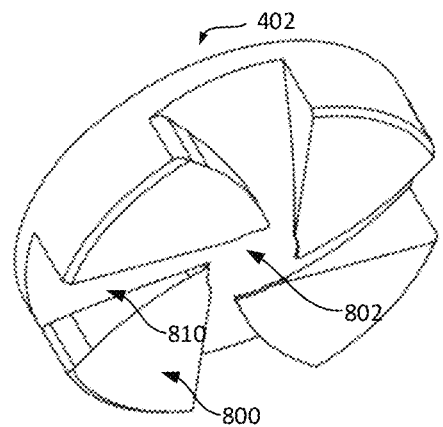
Figure 16A:
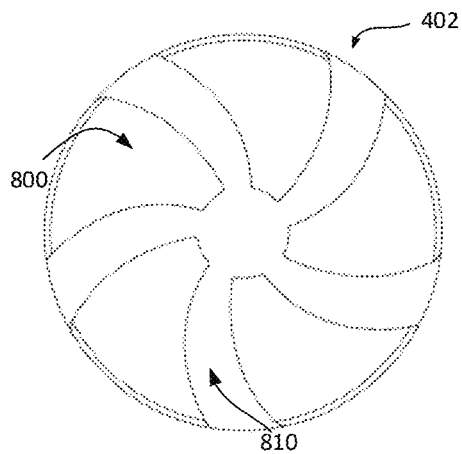
FIG. 16a is a schematic diagram of the turntable provided by another embodiment of the present application.
Figure 16B:
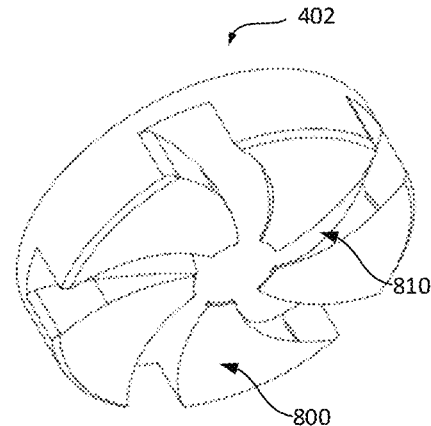
Figure 19A:
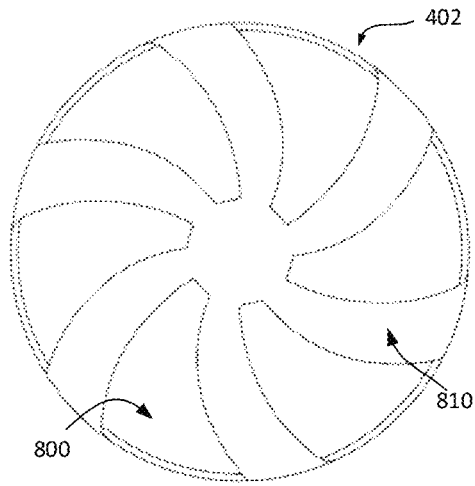
FIG. 19a is a schematic diagram of the turntable provided by another embodiment of the present application.
Figure 19B:
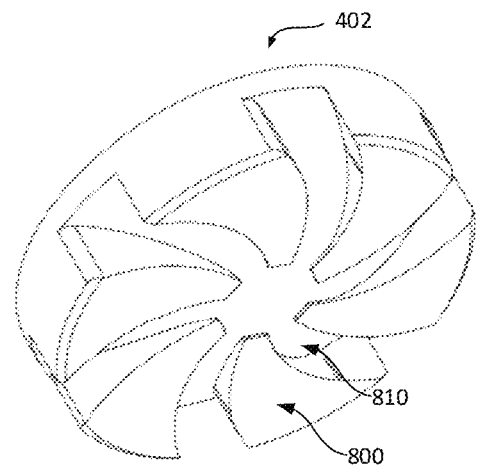

Please refer to FIGS. 6 and 9 which are schematic diagrams of the glue injection apparatus provided by another embodiment of the present application. In this embodiment, the glue injection apparatus is applied in, but not limited to, the field of low-pressure glue sealing, and it can also be used in the field of injection (or glue injection) molding, and the present application does not make any limitation to this.

In this embodiment, the glue injection apparatus comprises: a glue melting unit 400 including a rotatable turntable 402 and a fixed member 403, a feed groove being provided on a surface of the turntable 402 facing the fixed member 403, a raw material in the feed groove being melted into glue solution when the turntable 402 rotates relative to the fixed member 403; a temperature equalization unit 600 which is provided with a heating mechanism and a temperature equalization cavity 610, the glue solution entering the temperature equalization cavity 610 when the turntable 402 rotates, the heating mechanism capable of maintaining the glue solution in the temperature equalization cavity 610 at a same temperature; a glue injection unit 500 connected to the temperature equalization unit 600, the glue injection unit 500 capable of injecting the glue solution inside the temperature equalization cavity 610 into a mold.

The materials of the turntable 402 and the fixed member 403 can both be metal material or other materials having proper hardness, for example, both the turntable 402 and the fixed member 403 can be steel-made. In order to ensure that the fixed member 403 can be heated by the electromagnetic heating unit, the material of the fixed member 403 can be a ferrous metal. A surface of the turntable 402 which faces the fixed member 403 or which is provided with the feed groove is preferably in a circular shape, correspondingly, a surface of the fixed member 403 facing the turntable 402 is also preferably in a circular shape. Overall, the entirety of the turntable 402 can be configured as a disc.

The feed groove extends from a periphery to a center of the turntable 402. What needs to be explained is that, the feed groove is not limited to the spiral groove in the previous embodiment, instead, the feed groove can extend from the periphery to the center of the turntable in form of a spiral of Archimedes or an involute or a hyperbola or a cycloid, etc., wherein any form of the feed groove can be selected to perform glue melting according to situations of practical application. Meanwhile, the number of the feed groove on the turntable 402 may be one, and may also be plural. A preferential selection can be made to the number and form of the feed groove according to characteristics of the sizing material and the amount of the inlet glue.

In this embodiment, during the rotation process of the turntable 402, a particulate raw material (of course, the raw material may also be thread like or powder like) enters the feed groove. The thermoplastic raw material is continuously pushed from the outer circle to the center of the turntable 402. The particulate raw material suffers from increasing squeezing and rubbing in the motion process, and is melted gradually into glue solution in the feed groove as the temperature rises gradually, and then the glue solution enters the glue injection unit 500 at a tail end of the feed groove (the center of the turntable 402).

By such a design, it is realized to allow the solid particulate raw material to be fed and be rapidly heated to become liquid hot-melt glue during the process of rotation of the turntable 402, thereby realizing rapid melting and achieving the effect of melting for immediate consumption. Therefore, this embodiment fundamentally solves the defective rate of the packaged electronic products and risk of blockage of the glue injection flow path resulted from aging and carbonization phenomena of the raw material caused by repeated heating and boiling under the condition of high temperature.

In this embodiment, the turntable 402 and the fixed member 403 can be provided in a way similar to parallel setting (the opposite surfaces of them are provided parallel to each other), the turntable 402 can be placed vertically (i.e., the glue melting surface is parallel to a vertical plane), and can also be placed horizontally (i.e., the surface of the turntable is parallel to a horizontal plane).

For smooth glue solution outlet, as a preferred embodiment, as shown in FIG. 6, the turntable 402 is horizontally provided; the fixed member 403 can be placed beneath the turntable 402. A glue outlet through-hole is provided at a position of the fixed member 403 corresponding to a center of the turntable 402, and the glue outlet through-hole is in communication with the temperature equalization cavity 610. To be specific, the glue outlet through-hole extends in a vertical direction.

Such a setting can make full use of the "weissenberg effect". During the rotation process of the turntable 402, the glue solution formed at the center of the turntable 402 protrudes just along the gravity direction of the glue solution, meanwhile, the glue outlet through-hole is located beneath the protrusion of the glue solution, and thus the glue solution can enter the glue outlet through-hole smoothly.

In this embodiment, no specific limitation is made to the positional relationship between the glue melting unit 400 and the temperature equalization unit 600 as long as the glue solution generated in the glue melting unit 400 can enter the temperature equalization cavity 610 of the temperature equalization unit 600, wherein, in a flow direction of the glue solution, the temperature equalization unit 600 or temperature equalization cavity 610 is provided between the glue melting unit 400 and the glue injection unit 500. In order to make it easy for the glue solution to enter the temperature equalization cavity 610, considering that the turntable 402 and the fixed member 403 can be provided horizontally, the glue melting unit 400 can be preferably provided above the temperature equalization unit 600.

By such a setting, the glue solution generated by the glue melting unit 400 can not only enter the temperature equalization cavity 610 depending on the weissenberg effect, but can also flow into the temperature equalization cavity 610 by the force of gravity, thereby ensuring fast outflow of the glue solution and preventing the glue solution from silting in the glue melting unit 400. As shown in FIG. 6, the glue outlet through-hole (not shown) opened on the fixed member 403 can be led into the temperature equalization cavity 610.

The temperature equalization unit 600 can uniform the temperature of the glue solution in the temperature equalization cavity 610 at a same temperature, so as to prevent the glue solution ejected from the glue injection unit 500 from having a non-uniform temperature thereby influencing the molding quality of the glue solution.

The amount of glue generated by the glue melting unit 400 is large when the glue injection amount is large, while the temperatures of the produced glue solutions cannot be kept uniform; besides, the temperature differences between the glue solutions may also be increased during the flowing process of the glue solution before the glue solutions are ejected out, which results in great temperature differences between the ejected glue solutions and poor molding qualities.

Based on the considerations, the temperature equalization unit 600 of this embodiment can uniform the temperature of the glue solution at a same temperature after the glue solution is discharged from the glue melting unit 400 and before the glue injection performed by the glue injection unit 500, thus the temperatures of the glue solutions input into the glue injection unit 500 are kept uniform, allowing the temperatures of the glue solutions ejected by the glue injection unit to be the same, thereby improving the molding qualities of the glue solution.

The temperature equalization unit 600 includes a heating mechanism and a temperature equalization cavity 610. The glue solution will stay for a certain period of time in the temperature equalization cavity 610 after the glue solution enters from the glue melting unit 400 into the temperature equalization cavity 610. The heating mechanism can have a target heating temperature and keep heating the temperature equalization cavity 610 under the target heating temperature.

In this embodiment, the temperature equalization cavity 610 can have a plurality of configurations, for example, it may be a cylindrical cavity, a spherical cavity, a prismatic cavity, a tapered cavity or an irregular cavity, and the present application does not make any specific limitation to this. In order to facilitate the setting, a cross section of the temperature equalization cavity 610 on a horizontal plane is a circular shape or a regular polygonal shape. One can also think that the temperature equalization cavity 610 can be a cylindrical cavity or a prismatic cavity.

In this embodiment, the heating mechanism can heat the temperature equalization cavity 610. It can heat the shell 630 where the temperature equalization cavity 610 is located, and can also heat an interior of the temperature equalization cavity 610, or can directly heat the glue solution inside the temperature equalization cavity 610. Preferably, the heating mechanism can be located inside the temperature equalization cavity 610, so that the heating mechanism can directly heat the glue solution inside the temperature equalization cavity 610.

Further, the heating mechanism can be a heating panel, a heating wire, a heating plate or a heating rod, etc.; it can be a resistance heating element, and can also be a PTC heating element, etc.; the heating mechanism can even be an electromagnetic heating element which heats the internal glue solution of the temperature equalization cavity 610 by electromagnetism when a ferrous metal is provided inside the temperature equalization cavity 610. It can be seen that the heating mechanism can have a plurality of structures, shapes and configurations, and the present application does not make any specific limitation to this as long as the heating mechanism can rise the temperatures in the temperature equalization cavity to a same temperature.

As shown in FIG. 6, preferably, the heating mechanism may include a plurality of heating panels 620, which can be distributed in a circumferential direction, wherein, the heating panels 620 are disposed vertically, the glue solution exists in a sector region between two adjacent heating panels 620, and since the heating surface of the heating panel 620 is relatively large, the heating efficiency can be improved to make the glue solution get to the same temperature rapidly.

In this embodiment, no specific limitation is made to the number of the heating panel 620, for example, the number of the heating panel 620 may be 5 to 10. In reality, the number of the heating panel 620 can be selected flexibly according to actual situations.

In this embodiment, the glue injection unit 500 is provided with an input one-way valve 503, and the glue solution in the temperature equalization cavity 610 enters the glue injection unit 500 through the input one-way-valve 503.

To be specific, the glue injection unit 500 may include: a main body 510 provided with a cavity, an input one-way valve 503 in communication with the cavity and a plunger pump 502 in communication with an interior of the cavity. The input one-way valve 503 is opened when a pressure differential outside the cavity is greater than an internal pressure differential. The input one-way valve 503 is opened when the plunger pump 502 executes a suction action, and the input one-way valve 503 is closed when the plunger pump 502 executes an expelling action.

The temperature equalization unit 600 and the glue injection unit 500 are constructed integrally. To be specific, the temperature equalization unit 600 includes a shell 630 that has the temperature equalization cavity 610, and the shell 630 is constructed integrally with the main body 510 of the glue injection unit 500, wherein, the temperature equalization cavity 610 can be formed by directly making a chamfer on the shell 630 of the temperature equalization unit 600. As shown in FIGS. 6 and 9, the glue injection unit 500 is led into a bottom of the temperature equalization cavity 610 through a glue solution flow path 404.

In this embodiment, the glue injection apparatus may also include a temperature detecting mechanism (not shown) which can detect the temperature in the temperature equalization cavity 610, wherein, the temperature detecting mechanism can be provided on an inner wall of the temperature equalization cavity 610, thereby accurately reflecting the temperature of the current glue solution. To be specific, the temperature detecting mechanism can be a temperature sensor.

In this embodiment, the glue injection apparatus may also include a control mechanism (not shown), which is connected to the heating mechanism and the temperature detecting mechanism, and is capable of controlling a target temperature of the heating mechanism according to the temperature detected by the temperature detecting mechanism.

In this embodiment, the control mechanism can be a hardware entity unit, and can also be a software program module, and of course can also be a combination of hardware and software. For example, the control mechanism may be a computer, a PLC, a main control panel, etc., wherein, the control mechanism controls the heating mechanism in a plurality of ways, such as controlling the heating power and heating current, and the present application does not make any limitation to this.

Please refer to FIGS. 10a to 21b which are diagrams of the turntable 402 used for glue melting provided by a plurality of embodiments of the present application. In the embodiments, the turntable 402 can perform glue melting in cooperation with the fixed member 403. The turntable 402 is applied in, but not limited to, the field of low-pressure glue sealing of electronic elements, and it can also be used in the field of injection (or glue injection) molding, and the present application does not make any limitation to this.

In one embodiment, the turntable 402 has a glue melting surface 800 on which a feed groove 810 is provided; the feed groove 810 extends from a periphery to a center 802 of the glue melting surface 800; a groove width of the feed groove 810 gradually decreases from the periphery to the center 802 of the glue melting surface 800; and the turntable 402 can cooperate with the fixed member 403 when rotating, so as to melt the raw material in the feed groove 810 into glue solution.

In this embodiment, during the rotation process of the turntable 402, the particulate raw material (of course, the raw material may also be thread like or powder like) enters the feed groove 810. The thermoplastic raw material is constantly pushed from the periphery (also referred to as edge) to the center 802 of the turntable 402. Since the groove width of the feed groove 810 gradually decreases from the periphery to the center 802 of the turntable 402, the particulate raw material suffers from increasing squeezing and rubbing in the motion process, and is gradually melted into glue solution in the feed groove 810 as the temperature increases gradually, and then the glue solution enters the glue injection unit 500 at a tail end of the feed groove 810 or the center 802 of the turntable 402.

By such a design, it is realized to allow the solid raw material to be fed and be rapidly heated to become liquid hot-melt glue during the process of rotation of the turntable, thereby realizing rapid melting and achieving the effect of melting for immediate consumption. Therefore, this embodiment can fundamentally solve the defective rate of the packaged electronic products and risk of blockage of the glue injection flow path resulted from aging and carbonization phenomena of the raw material caused by repeated heating and boiling under the condition of high temperature.

The turntable 402 is in a flat cylindrical shape as a whole, one side of it is the glue melting surface 800, while the other side of it can be connected to a power unit such as an electric machine or a motor, so as to drive the turntable 402 to rotate. Generally speaking, a position on the rotational axis of the power unit which connects to the turntable 402 is also the position of the center 802 of the turntable 402, thereby avoiding eccentric rotations of the turntable 402, which may influence the glue melting work.

The glue melting surface 800 of the turntable 402 is provided to face a fixed member 403 (which sometimes is also referred to as a fixed disc), and a gap may exist between the turntable 402 and the fixed member 403. When the raw material enters the feed groove 810 or the gap, the raw material will be melted into glue solution gradually under the combined action of rubbing and shearing on the surface of the turntable 402, rubbing and shearing at the transitional bending position between a side wall 803 of the feed groove 810 and the glue melting surface 800, and squeezing and rubbing between the raw materials themselves.

The material of the turntable 402 can be a metal material or other materials having proper hardness, for example, the turntable 402 can be steel-made. The glue melting surface 800 of the turntable 402 (the surface facing the fixed member 403 or the surface provided with the feed groove 810) is preferably in a circular shape. Overall, the entirety of the turntable 402 can be configured as a disc.

The turntable 402 can have a plurality of structural configurations. The turntable 402 itself may be irregularly shaped, provided that a cylindrical protrusion is formed thereon, the glue melting surface 800 can be located on an end face of the cylindrical protrusion, and the turntable 402 rotates about an axis of the cylindrical protrusion.

Of course, in one embodiment, the turntable 402 itself may also be in a (flat) cylindrical shape, namely, the turntable 402 is preferably to be a round disc. In this embodiment, the glue melting surface 800 is located on an end face of the turntable 402, and the other end face (reference can be made to FIG. 6, in which the other end of the turntable 402 facing away from the glue melting surface 800 is an upper end face, while the glue melting surface 800 is a lower surface) of the turntable 402 facing away from the glue melting surface 800 may be provided with a connection part (such as a thread groove, etc.) that connects to the rotational axis.

Between the glue melting surface 800 and the surface on which the connection part is located of the turntable 402 is an outer edge surface of the turntable 402 (which can be understood as the side surface of a cylinder if the turntable 402 is described as a flat cylinder), and the outer edge surface of the turntable 402 encloses a cylindrical shape. The feed groove 810 forms a feed port 801 on the outer edge surface of the turntable 402, wherein, the raw material can enter the feed groove 810 from the feed port 801.

In this embodiment, the glue melting surface 800 may also have a plurality of shapes, such as a circular shape, a square shape or other polygonal shapes. Considering practical applications and for ease of manufacture, the glue melting surface 800 is preferably to have a circular shape.

The feed groove 810 extends from the periphery to the center 802 of the turntable 402 (or the glue melting surface 800). The center 802 is the center 802 (or centroid) of the turntable 402, and can also be a position at which the rotational axis, around which the turntable 402 is rotated, passes through the glue melting surface 800. Therefore, it can also be understood that the feed groove 810 extends from the periphery of the glue melting surface 800 to the rotational axis of the turntable 402.

In this embodiment, the groove width of the feed groove 810 gradually decreases from the periphery to the center 802 of the glue melting surface 800, wherein, the groove width of the feed groove 810 is a width perpendicular to the extending direction in the plane where the feed groove 810 is located. The feed groove 810 has two opposed side walls 803, and the width of the feed groove 810 can be a distance between the two side walls 803. The width of the feed groove 810 gradually decreases on the glue melting surface 800 from the outside in.

By such a setting, when compared to a feed groove 810 with a constant width, the feed groove 810 of this embodiment can properly reduce the processing length while still maintaining good glue melting effects, and can facilitate the processing, or, have better glue melting effects under the same length. Meanwhile, the feeding rate and feeding amount can also be largely improved to thereby satisfy the usage requirement of large glue injection amount.

Furthermore, the groove depth of the feed groove 810 gradually decreases (or becomes shallower) from the periphery to the center 802 of the turntable 402. By such a setting, it is possible to intensify the effect of actions such as squeezing, rubbing and shearing during the process of delivery of the raw material in the feed groove 810, which accelerates the rise of temperature of the raw material, and thereby improves the glue melting efficiency. Meanwhile, this can further improve the feeding speed and feeding amount, thereby satisfying the usage requirement of large glue injection amount. Furthermore, in order to realize smooth material feeding, a curvature change of the groove depth of the feed groove gradually decreases from the periphery to the center of the glue melting surface.

In this embodiment, the feed groove 810 can extend along a straight line or a curved line. As shown in FIGS. 11a, 11b, 13a, 13b, 15a, 15b, 17a, 17b, 18a and 18b, the feed groove 810 can extend along a straight line, and it can also be understood in such a way that the feed groove 810 is a linear groove as a whole, and extends straightly from the periphery to the center 802 of the glue melting surface 800.

In the other embodiments, as shown in FIGS. 10a, 10b, 12a, 12b, 14a, 14b, 16a, 16b, 19a, 19b, 20a, 20b, 21a and 21b, the feed groove 810 can extend along a curved line, and it can also be understood in such a way that the feed groove 810 is a curved groove as a whole, and extends along a straight line from the periphery to the center 802 of the glue melting surface 800. Of course, the present application does not make any limitation to the form of the curved line, and preferably, the feed groove 810 extends along at least one of the following curved lines: an arc, a cycloid, a hyperbola, a spiral line, and an involute.

As shown in FIGS. 11a, 11b, 13a, 13b, 15a, 15b, 17a, 17b, 18a and 18b, the feed groove 810 has two opposed side walls 803 which extend along different types of lines. In this embodiment, the feed groove 810 extends along a straight line as a whole and is namely a linear groove, wherein, one of the types of lines along which the two side walls 803 extend can be a straight line, while the other one can be a curved line, and of course, both side walls 803 can extend along different curved lines.

What needs to be explained is that, the present application does not exclude the solution in which the two side walls 803 extends along a same type of line, for example, as shown in FIGS. 10a, 10b, 12a, 12b, 14a, 14b, 16a, 16b, 19a, 19b, 20a, 20b, 21a and 21b, both side walls 803 extend along a curved line.

In conclusion, the feed groove 810 extends from the periphery to the center 802 of the turntable 402, wherein, the feed groove 810 is not limited to a spiral groove, instead, the feed groove 810 can extend from the periphery to the center 802 of the turntable 402 in form of a spiral of Archimedes or an involute or a hyperbola or a cycloid, etc., wherein any form of the feed groove 810 can be selected to perform glue melting according to situations of practical application.

Meanwhile, the number of the feed groove 810 on the turntable 402 can be one, and can also be plural; preferably, the feed groove 810 is plural in number, and arranged evenly in a circumferential direction.

To be specific, a preferential selection can be made to the number and form of the feed groove 810 according to the characteristic of the sizing material and the amount of the inlet glue. In one embodiment, the number of the feed grooves 810 is preferably from two to eight.

Figure 20A:
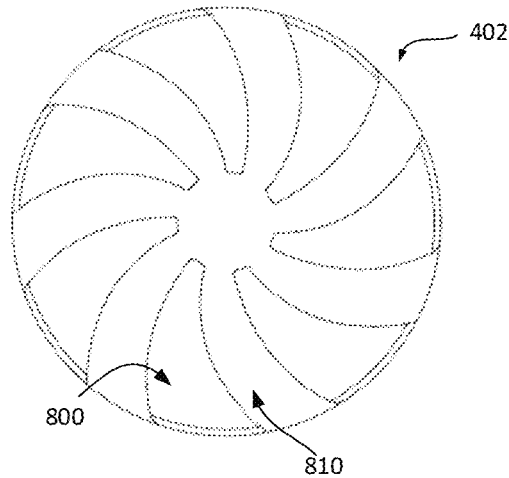
FIG. 20a is a schematic diagram of the turntable provided by another embodiment of the present application.
Figure 20B:
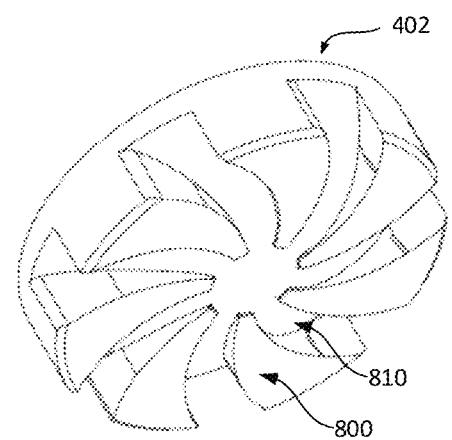
Figure 21A:
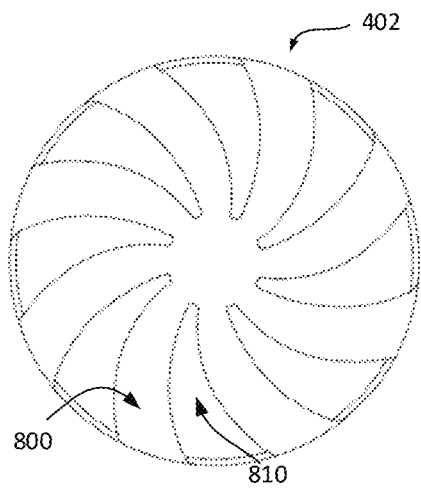
FIG. 21a is a schematic diagram of the turntable provided by another embodiment of the present application.
Figure 21B:
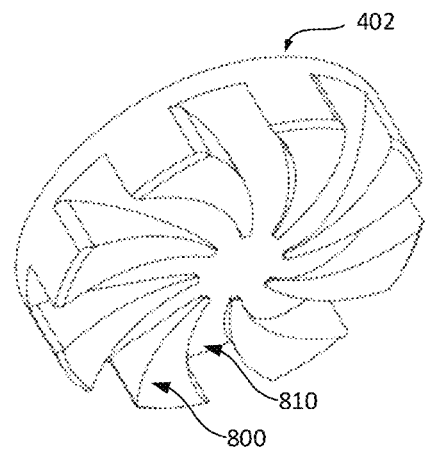
Figure 22A:
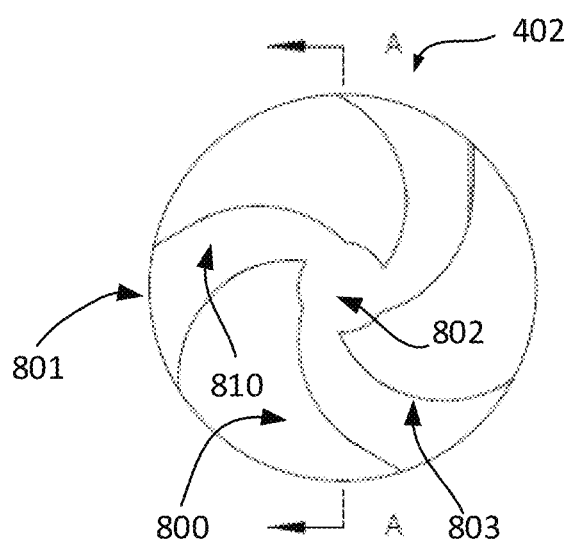
FIG. 22a is a schematic diagram of the turntable provided by another embodiment of the present application.
Figure 22B:
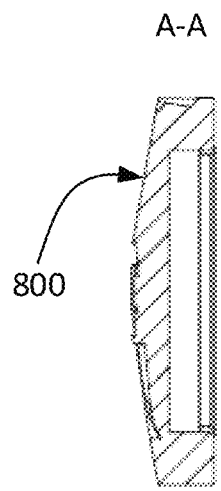
FIG. 22b is a section view of the turntable shown in FIG. 22a along A-A.
Figure 22C:
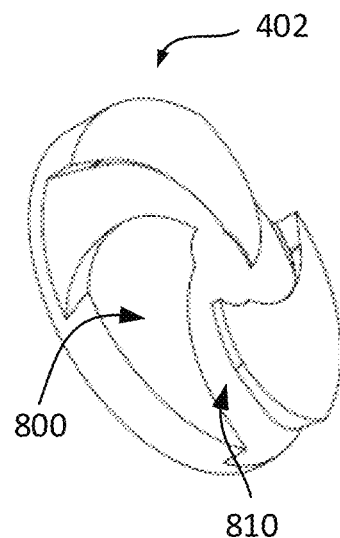
Figure 23A:
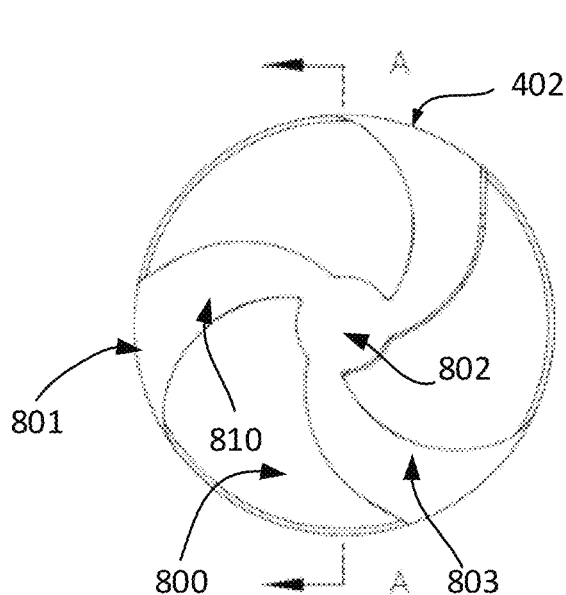
FIG. 23a is a schematic diagram of the turntable provided by another embodiment of the present application.
Figure 23B:
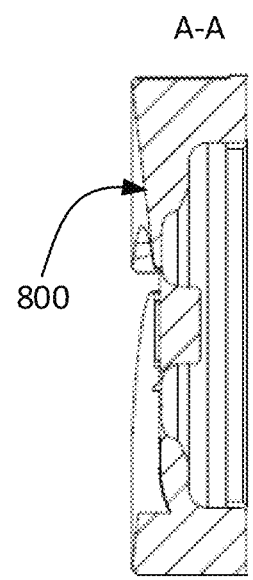
FIG. 23b is a cross sectional view of the turntable shown in FIG. 23a along A-A.
Figure 23C:
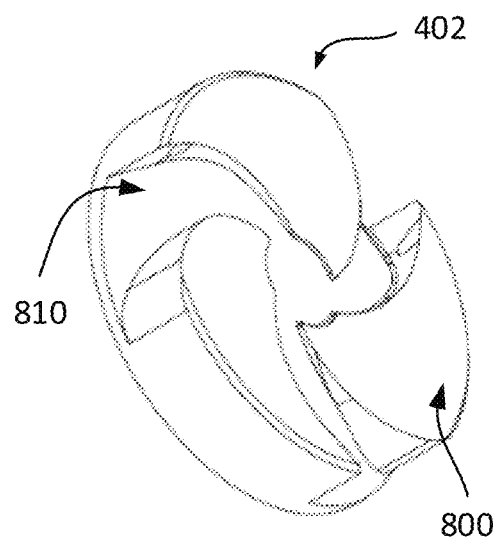
Figure 24A:
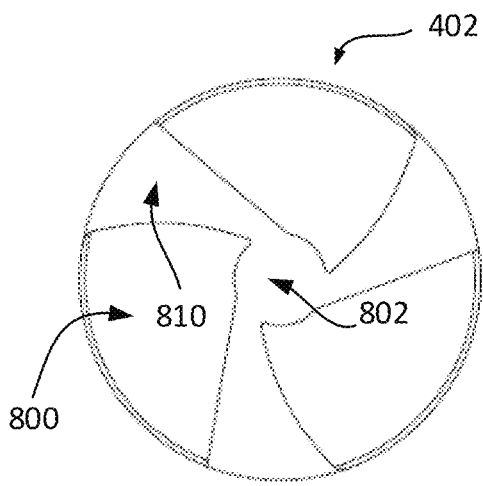
FIG. 24a is a schematic diagram of the turntable provided by another embodiment of the present application.
Figure 24B:
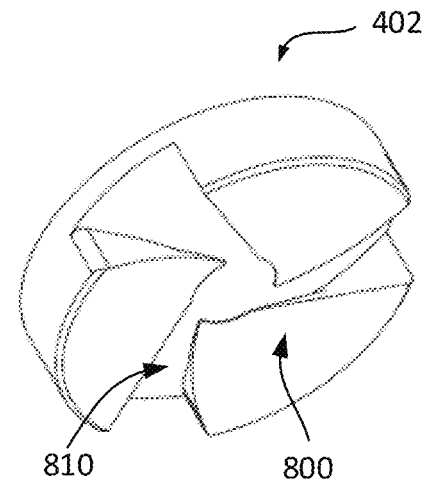
Figure 25A:
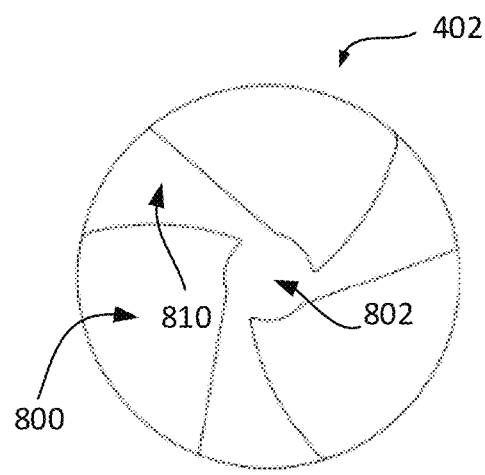
FIG. 25a is a schematic diagram of the turntable provided by another embodiment of the present application.
Figure 25B:
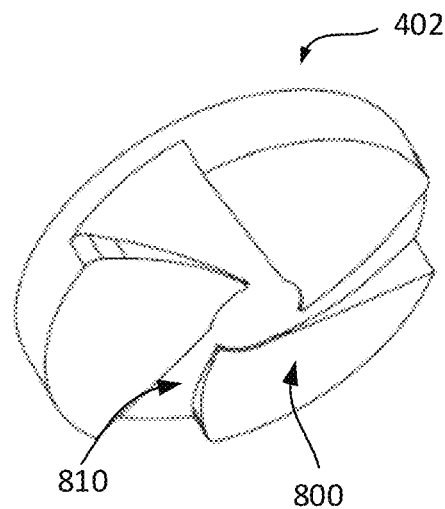

FIGS. 10a to 11b illustrate the structure of a differently constructed turntable 402 with two feed grooves 810; FIGS. 12a to 13b illustrate the structure of a differently constructed turntable 402 with three feed grooves 810; FIGS. 14a to 15b illustrate the structure of a differently constructed turntable 402 with four feed grooves 810; FIGS. 16 to 17a illustrate the structure of a differently constructed turntable 402 with five feed grooves 810; FIGS. 18a to 19a illustrate the structure of a differently constructed turntable 402 with six feed grooves 810; FIGS. 20a and 20b illustrate the structure of a turntable with seven feed grooves 810; FIGS. 21a and 21b illustrate the structure of a turntable with eight feed grooves 810.

Referring to FIG. 6, another embodiment of the present application also provides a glue melting unit 400. In this embodiment, the glue melting unit 400 is applied in, but not limited to, the field of low-pressure glue sealing of electronic elements, and it can also be used in the field of injection (or glue injection) molding, and the present application does not make any limitation to this. The glue melting unit 400 includes: a fixed member 403; and a turntable 402 according to the previous embodiment, a glue melting surface 800 of the turntable 402 being provided to face the fixed member 403.

Reference can be made to the turntable 402 in the above-mentioned embodiments for the shape, construction and function of the turntable 402 in this embodiment, and thus no redundant description will be made in this embodiment.

In this embodiment, the materials of the fixed member 403 and the turntable 402 can both be metal material or other materials having proper hardness, for example, both the turntable 402 and the fixed member 403 can be steel-made. In order to ensure that the fixed member 403 can be heated faster, the material of the fixed member 403 can be a ferrous metal. Continuing the foregoing descriptions, the glue melting surface 800 of the turntable 402 is preferably in a circular shape, correspondingly, a surface of the fixed member 403 facing the turntable 402 is also preferably in a circular shape.

In order to make full use of the above mentioned "weissenberg effect", a glue outlet through-hole in communication with the feed groove 810 can be provided on a center 802 of the fixed member 403, and the glue outlet through-hole is in communication with the glue injection unit 500 to input the glue solution into the glue injection unit 500.

In order to enhance the effect of conversion from mechanical energy to heat, the surface of the fixed member 403 facing the turntable 402 can also be provided with a feed groove 810, wherein, reference can be made to the form of the feed groove 810 on the turntable 402 in the above embodiments for the form of the feed groove 810 on the fixed member 403, but this does not mean that the shape and construction of the feed groove 810 on the fixed member 403 are the same as that of the feed groove 810 on the turntable 402, and the two may have different forms. The feed grooves 810 on the fixed member 403 may be plural in number, and converge at the glue outlet through-hole.

In this embodiment, the turntable 402 and the fixed member 403 can be provided in a way similar to parallel setting (the opposite surfaces of them are provided parallel to each other), the turntable 402 can be placed vertically (i.e., the glue melting surface 800 is parallel to a vertical plane), and can also be placed horizontally (i.e., the glue melting surface 800 is parallel to a horizontal plane).

For ease of smooth glue outlet, as a preferred embodiment, as shown in FIG. 6, the turntable 402 is provided horizontally; and the fixed member 403 is located beneath the turntable 402. The glue outlet through-hole is provided at a position of the fixed member 403 corresponding to the center 802 of the turntable 402, and the glue outlet through-hole extends in a vertical direction.

Such a setting can make full use of the "weissenberg effect". During the rotation process of the turntable 402, the glue solution formed at the center 802 of the turntable 402 protrudes just along the gravity direction of the glue solution, meanwhile, the glue outlet through-hole is located beneath the protrusion of the glue solution, and thus the glue solution can enter the glue outlet through-hole smoothly.

Referring to FIG. 6, another embodiment of the present application also provides a glue injection apparatus. In this embodiment, the glue injection apparatus is applied in, but not limited to, the field of low-pressure glue sealing, and it can also be used in the field of injection (or glue injection) molding, and the present application does not make any limitation to this. In this embodiment, the glue injection unit comprises: a glue melting unit 400 according to the above embodiments; a glue injecting unit 500 in communication with the glue melting unit 400, the glue solution entering the glue injecting unit 500 when the turntable 402 rotates, and the glue injecting unit 500 being capable of injecting the glue solution inside it into a mold.

To be specific, the glue injection unit 500 may include a plunger pump 502 and/or a glue injection gun. Preferably, the glue injection unit 500 may include a plunger pump 502 which is provided with a plunger cavity and a plunger rod. The glue outlet through-hole can communicate with the plunger cavity of the plunger pump 502 through a delivery flow path 404.

In this embodiment, the plunger pump 502 can include a plunger cavity and a plunger rod. The plunger rod can move up and down in the plunger cavity. The delivery flow path 404 (also referred to as the glue delivery tube) is provided between the glue outlet through-hole and the plunger cavity. In order to prevent the glue solution from flowing back, a one-way valve 503 can be provided in the delivery flow path 404.

Please refer to FIGS. 22a to 25b, which are diagrams of the turntable 402 used for glue melting provided by a plurality of embodiments of the present application. In the embodiments, the turntable 402 can perform glue melting in cooperation with the fixed member 403. The turntable 402 is applied in, but not limited to, the field of low-pressure glue sealing of electronic elements, and it can also be used in the field of injection (or glue injection) molding, and the present application does not make any limitation to this.

In one embodiment, the turntable 402 has a glue melting surface 800 on which a feed groove 810 is provided; the feed groove 810 extends from the periphery to the center 802 of the glue melting surface 800; the glue melting surface protrudes or sinks from the periphery to the center thereof; and the turntable 402, when rotated, can cooperate with the fixed member to melt the raw material in the feed groove 810 into glue solution.

In this embodiment, during the rotation process of the turntable 402, the particulate raw material (of course, the raw material may also be thread like or powder like) enters the feed groove 810. The thermoplastic raw material is constantly pushed from the periphery (also referred to as the edge) to the center 802 of the turntable 402. Since the groove width of the feed groove 810 gradually decreases from the periphery to the center 802 of the turntable 402, the particulate raw material suffers from increasing squeezing and rubbing in the motion process, and is gradually melted into glue solution in the feed groove 810 as temperature increases gradually, and then the glue solution enters the glue injection unit 500 at a tail end of the feed groove 810 or the center 802 of the turntable 402.

By such a design, it is realized to allow the solid raw material to be fed and be rapidly heated to become liquid hot-melt glue during the process of rotation of the turntable, thereby realizing rapid melting and achieving the effect of melting for immediate consumption. Therefore, this embodiment can fundamentally solve the defective rate of the packaged electronic products and risk of blockage of the glue injection flow path resulted from aging and carbonization phenomena of the raw material caused by repeated heating and boiling under the condition of high temperature.

The turntable 402 is in a flat shape as a whole, one side of it is the glue melting surface 800, while the other side of it can be connected to a power unit such as an electric machine or a motor, so as to drive the turntable 402 to rotate. Generally speaking, a position on the rotational axis of the power unit that connects to the turntable 402 is also a position of the center 802 of the turntable 402, thereby avoiding eccentric rotations of the turntable 402, which may influence the glue melting work.

The glue melting surface 800 of the turntable 402 is provided to face a fixed member 403 (which sometimes can be referred to as a fixed disc), and a gap may exist between the turntable 402 and the fixed member 403. When the raw material enters the feed groove 810 or the gap, the raw material will be melted into glue solution gradually under the combined action of rubbing and shearing on the surface of the turntable 402, rubbing and shearing at the transitional bending position between a side wall 803 of the feed groove 810 and the glue melting surface 800, and squeezing and rubbing between the raw materials themselves.

The material of the turntable 402 can be a metal material or other materials having proper hardness, for example, the turntable 402 can be steel-made. The glue melting surface 800 (the surface facing the fixed member 403 or the surface provided with the feed groove 810) of the turntable 402 is preferably in a circular shape. Overall, the entirety of the turntable 402 can be configured as a disc.

The turntable 402 can have a plurality of structural configurations. The turntable 402 itself can be irregular shaped, provided that a cylindrical protrusion is formed thereon, the glue melting surface 800 can be located on an end face of the cylindrical protrusion, and the turntable 402 rotates about an axis of the cylindrical protrusion.

Of course, in one embodiment, the turntable 402 itself may also be in a (flat) cylindrical shape, namely, the turntable 402 is preferably to be a circular disc. In this embodiment, the glue melting surface 800 is located on an end face of the turntable 402, and the other end face (reference can be made to FIG. 6, in which the other end of the turntable 402 facing away from the glue melting surface 800 is an upper end face, while the glue melting surface 800 is a lower surface) of the turntable 402 facing away from the glue melting surface 800 may be provided with a connection part (such as a thread groove, etc.) that connects to the rotational axis.

Between the surfaces of the turntable 402 on which the glue melting surface 800 and the connection part are located is an outer edge surface of the turntable 402 (which can be understood as the side surface of a cylinder if the turntable 402 is described as a flat cylinder), and the outer edge surface of the turntable 402 encloses a cylindrical shape. The feed groove 810 forms a feed port 801 on the outer edge surface of the turntable 402, wherein, the raw material can enter the feed groove 810 from the feed port 801.

In this embodiment, the glue melting surface gradually protrudes or sinks from the periphery to the center thereof, for example, a contour line of a cross section of the glue melting surface 800 can be a straight line, and can also be a curved line, such as an arc or a curved line with a gradually reducing curvature change.

The glue melting surface 800 is tapered surface, such as a conical surface, a rectangular pyramid surface or other polygonal pyramid surfaces. Considering practical applications and for ease of manufacture, the glue melting surface 800 is preferably a conical surface. To facilitate the glue melting and miniaturize the device, the degree of taper of the glue melting surface 800 can be 1:3 to 5:1.

The feed groove 810 extends from the periphery to the center 802 of the turntable 402 (or the glue melting surface 800). The center 802 is the center 802 (or centroid) or the turntable 402, and can also be a position at which the rotational axis, around which the turntable 402 is rotated, passes through the glue melting surface 800. Therefore, it can also be understood in such a way that the feed groove 810 extends from the periphery of the glue melting surface 800 to the rotational axis of the turntable 402.

In this embodiment, the groove width of the feed groove 810 gradually decreases from the periphery to the center 802 of the glue melting surface 800, wherein, the groove width of the feed groove 810 is a width perpendicular to the extending direction in the plane where the feed groove 810 is located. The feed groove 810 has two opposed side walls 803, and the width of the feed groove 810 can be a distance between the two side walls 803. The width of the feed groove 810 gradually decreases on the glue melting surface 800 from the outside in.

By such a setting, when compared to a feed groove 810 with a constant width, the feed groove 810 of this embodiment can properly reduce the processing length while still maintaining good glue melting effects, and can facilitate the processing, or, have better glue melting effects under the same length. Meanwhile, the feeding rate and feeding amount can also be largely improved to thereby satisfy the usage requirement of large glue injection amounts.

Further, the groove depth of the feed groove 810 gradually decreases (or becomes shallower) from the periphery to the center 802 of the turntable 402. By such a setting, it is possible to intensify the effect of actions such as squeezing, rubbing and shearing during the process of delivery of the raw material in the feed groove 810, which accelerates the rise of temperature of the raw material, and thereby improves the glue melting efficiency. Meanwhile, this can further improve the feeding speed and feeding amount to thereby satisfy the usage requirement of large glue injection amounts. Furthermore, in order to realize smooth material feeding, a curvature change of the groove depth of the feed groove remains unchanged, or gradually decreases, or gradually increases from the periphery to the center of the glue melting surface.

In this embodiment, the feed groove 810 can extend along a straight line or a curved line. As shown in FIGS. 24*a*, 24*b*, 25*a* and 25*b*, the feed groove 810 can extend along a straight line, and it may also be understood in such a way that the feed groove 810 is a linear groove as a whole, and extends straightly from the periphery to the center 802 of the glue melting surface 800.

In other embodiments, for example, as shown in FIGS. 22*a*, 22*b*, 22*c*, 23*a*, 23*b* and 23*c*, the feed groove 810 can extend along a curved line, and it can also be understood in such a way that the feed groove 810 is a curved groove as a whole, and extends along a straight line from the periphery to the center 802 of the glue melting surface 800. Of course, the present application does not make any limitation to the form of the curved line; preferably, the feed groove 810 extends along at least one of the following curved lines: an arc, a cycloid, a hyperbola, a spiral line, and an involute.

In conclusion, the feed groove 810 extends from the periphery to the center 802 of the turntable 402, wherein, the feed groove 810 is not limited to a spiral groove, instead, the feed groove 810 can extend from the periphery to the center 802 of the turntable 402 in form of a spiral of Archimedes or an involute or a hyperbola or a cycloid, etc., wherein any form of the feed groove can be selected to perform glue melting according to situations of practical application.

Meanwhile, the number of the feed groove 810 on the turntable 402 can be one, and can also be plural; preferably, the feed groove 810 is plural in number, and arranged evenly in a circumferential direction.

To be specific, a preferential selection can be made to the number and form of the feed groove 810 according to the characteristic of the sizing material and the amount of the inlet glue. In one embodiment, the number of the feed grooves 810 is preferably two to eight. FIGS. 22a to 25b illustrate the structure of a differently constructed turntable 402 with three feed grooves 810.

Referring to FIG. 6, another embodiment of the present application also provides a glue melting unit 400. In this embodiment, the glue melting unit 400 is applied in, but not limited to the field of low-pressure glue sealing of electronic elements, and it can also be used in the field of injection (or glue injection) molding, and the present application does not make any limitation to this. The glue melting unit 400 includes: a fixed member 403; and a turntable 402 according to any of the previous embodiments, a glue melting surface 800 of the turntable 402 being provided to face the fixed member 403.

Reference can be made to the turntable 402 in the above-mentioned embodiments for the shape, construction and function of the turntable 402 in this embodiment, and thus no redundant description will be made in this embodiment.

In this embodiment, the materials of the fixed member 403 and the turntable 402 can both be metal material or other materials having proper hardness, for example, both the turntable 402 and the fixed member 403 can be steel-made. A surface of the fixed member 403 facing the turntable 402 is adapted to the glue melting surface 800, for example, when the glue melting surface 800 is a protruding tapered surface, the surface of the fixed member 403 facing the turntable 402 is concaved; and when the glue melting surface 800 is a concave tapered surface, the surface of the fixed member 403 facing the turntable 402 protrudes. To continue the foregoing descriptions, the glue melting surface 800 of the turntable 402 is preferably in a circular shape, correspondingly, a surface of the fixed member 403 facing the turntable 402 is also preferably in a circular shape.

In order to make full use of the above mentioned "weissenberg effect", a glue outlet through-hole in communication with the feed groove 810 can be provided on a center 802 of the fixed member 403, and the glue outlet through-hole is in communication with the glue injection unit 500 to input the glue solution into the glue injection unit 500.

In order to enhance the effect of conversion from mechanical energy to heat, the surface of the fixed member 403 facing the turntable 402 can also be provided with a feed groove 810, wherein, reference can be made to the form of the feed groove 810 on the turntable 402 in the above embodiments for the form of the feed groove 810 on the fixed member 403, but this does not mean that the shape and construction of the feed groove 810 on the fixed member 403 are the same as that of the feed groove 810 on the turntable 402, and the two may have different forms. The feed grooves 810 on the fixed member 403 may be plural in number, and converge at the glue outlet through-hole.

In this embodiment, the turntable 402 and the fixed member 403 can be provided in a way similar to parallel setting (the opposite surfaces of them are provided parallel to each other), the turntable 402 can be placed vertically (i.e., the glue melting surface 800 is parallel to a vertical plane), and can also be placed horizontally (i.e., the glue melting surface 800 is parallel to a horizontal plane).

For ease of smooth glue outlet, as a preferred embodiment, as shown in FIG. 5, the turntable 402 is provided horizontally; the fixed member 403 is located beneath the turntable 402. The glue outlet through-hole is provided at a position of the fixed member 403 corresponding to the center 802 of the turntable 402, and the glue outlet through-hole extends in a vertical direction.

Such a setting can make full use of the "weissenberg effect". During the rotation process of the turntable 402, the glue solution formed at the center 802 of the turntable 402 protrudes just along the gravity direction of the glue solution, meanwhile, the glue outlet through-hole is located beneath the protrusion of the glue solution, and thus the glue solution can enter the glue outlet through-hole smoothly.

Referring to FIG. 6, another embodiment of the present application also provides a glue injection apparatus. In this embodiment, the glue injection apparatus is applied in, but not limited to, the field of low-pressure glue sealing, and it can also be used in the field of injection (or glue injection) molding, and the present application does not make any limitation to this. In this embodiment, the glue injection unit comprises: a glue melting unit 400 according to the above embodiments; a glue injecting unit 500 in communication with the glue melting unit 400, the glue solution entering the glue injecting unit 500 when the turntable 402 rotates, and the glue injecting unit 500 being capable of injecting the glue solution therein into a mold.

To be specific, the glue injection unit 500 may include a plunger pump 502 and/or a glue injection gun. Preferably, the glue injection unit 500 may include a plunger pump 502 which is provided with a plunger cavity and a plunger rod. The glue outlet through-hole can communicate with the plunger cavity of the plunger pump 502 through a delivery flow path 404.

In this embodiment, the plunger pump 502 can include a plunger cavity and a plunger rod. The plunger rod can move up and down in the plunger cavity. The delivery flow path 404 (also referred to as the glue delivery tube) is provided between the glue outlet through-hole and the plunger cavity. In order to prevent the glue solution from flowing back, a one-way valve 503 can be provided in the delivery flow path 404.

Please refer to FIG. 6 and FIGS. 26 to 32, which are diagrams of the glue injection unit 500 used for glue injection molding provided by a plurality of embodiments of the present application. In the embodiments, the glue injection unit 500 injects the glue into a mold. The glue injection unit 500 is applied in, but not limited to, the field of low-pressure glue sealing of electronic elements, and it can also be used in other fields of injection (or glue injection) molding, and the present application does not make any limitation to this.

In one embodiment, the glue injection unit 500 used for glue injection molding includes: a main body 510 which is provided with a cavity 505; an input one-way valve 503 which is in communication with the cavity 505, the input one-way valve 503 being opened when a pressure differential outside the cavity 505 is greater than an internal pressure differential so as to input the glue solution; an output one-way valve 504 which is in communication with the cavity 505, the output one-way valve 504 being opened when a pressure differential inside the cavity 505 is greater than an external pressure differential so as to expel the glue solution; a plunger pump 502 which is in communication with an interior of the cavity 505; the input one-way valve 503 being opened and the output one-way valve 504 being closed when the plunger pump 502 executes a suction action; the output one-way valve 504 being opened and the input one-way valve 503 being closed when the plunger 502 executes an expelling action.

By combining the plunger pump 502 with the output one-way valve 504 and the input one-way valve 503, the glue injection apparatus provided in this embodiment enables the input one-way valve 503 to be opened and the output one-way valve 504 to be closed when the plunger pump 502 executes a suction action, so as to input the glue solution into the cavity 505, and enables the output one-way valve 504 to be opened and the input one-way valve 503 to be closed when the plunger pump 502 executes an expelling action, so as to expel the glue solution from the cavity 505, thus there is no need to set a glue injection gun, which not only saves costs, allows easy operation and control, but also facilitates the miniaturization of the apparatus. In addition, the glue injection unit 500 is also applicable for glue injection works with a large glue injection amount (for example, above 10 g), and of course, the glue injection is also applicable to cases of micro or small glue injection amounts.

In this embodiment, the glue injection unit 500 can receive glue solution from the glue melting unit 400 and inject the glue solution into a mold, thereby finishing the glue injection molding, wherein, the glue solution received by the glue injection unit 500 can be produced by melting by the glue melting unit 400 at real time, and can also be glue solution stored in a glue melting cylinder. Of course, preferably, the glue solution received by the glue injection unit 500 is produced by melting by the glue melting unit 400 at real time.

In this embodiment, the main body 510 may also be understood as a shell which is opened with a cavity 505. The cavity 505 does not have a fixed shape, it can be a (sectional type) cylindrical cavity, and can also be a spherical or irregularly shaped cavity 505. Of course, the cavity 505 can be opened with an inlet and an outlet, wherein, the input one-way valve 503 is provided at the inlet position, while the outlet one-way valve 504 is provided at the outlet position.

Figure 26:
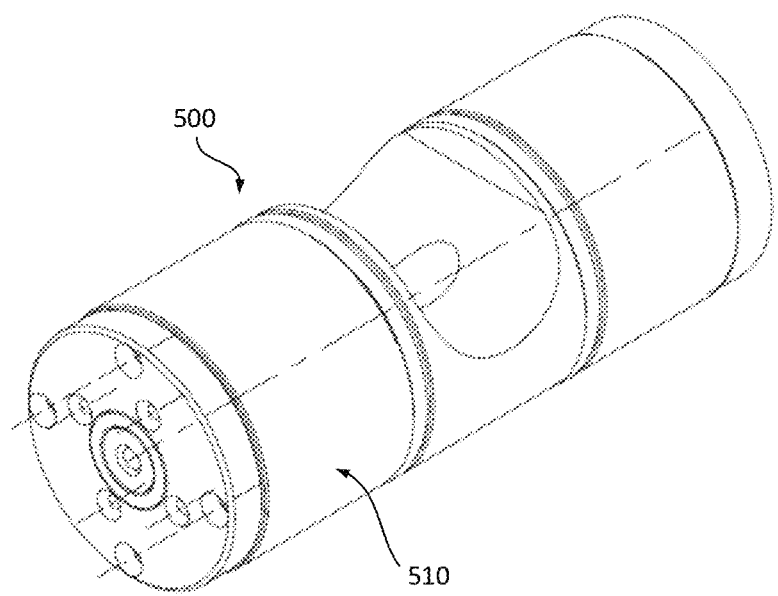
FIG. 26 is a stereogram of the glue injection unit in FIG. 6.
Figure 27:
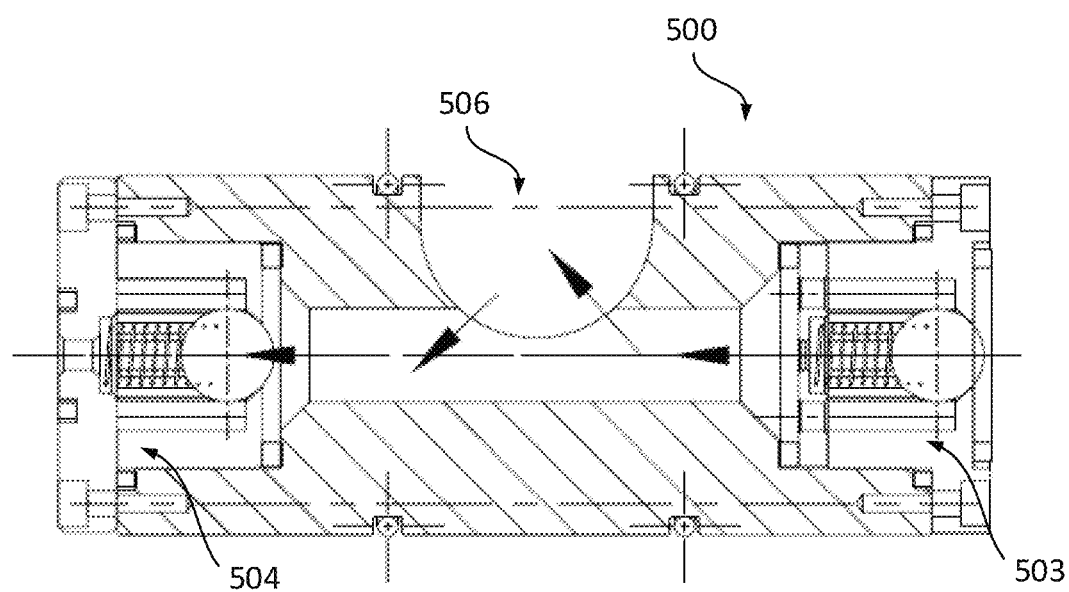
FIG. 27 is a section view of FIG. 26.
Figure 28:
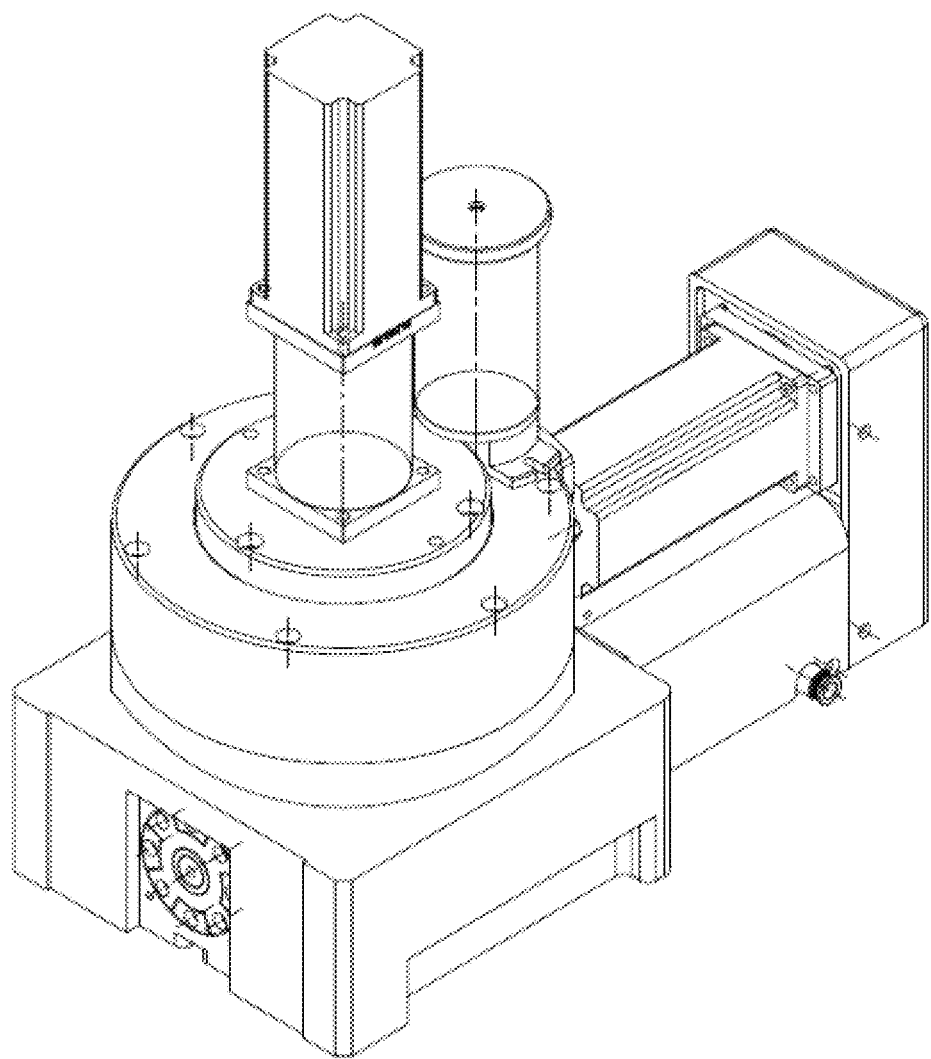
FIG. 28 is a stereogram of the structure of the glue injection apparatus provided by another embodiment of the present application.

In the embodiment shown in FIGS. 6 and 26-27, the cavity 505 can extend along a straight line; the input one-way valve 503 is provided in an end of the cavity 505, while the output one-way valve 504 is provided in the other end of the cavity 505.

In this embodiment, the cavity 505 is a linear cavity, which may also be referred to as a cylindrical cavity. The cavity 505 of such a shape is easy to be machined, and thus can save the manufacturing costs. The size of the cavity 505 can be matched with the glue injection amount, for example, the size of the cavity 505 can be slightly larger than the maximum outlet amount each time (or the maximum outlet amount of a single time), thereby avoiding silting of glue solution in the cavity.

As shown in FIG. 27, the input one-way valve 503 is provided in an interior of a right end of the cavity 505 (when the reader faces the FIG. 27), and the output one-way valve 504 is provided in an interior of a left end of the cavity 505. Of course, the input one-way valve 503 and the output one-way valve 504 are not limited to being set in the interior of the ends of the cavity 505, and they can also be set outside the ends of the cavity 505 as long as the input one-way valve 503 and the output one-way valve 504 can exert their respective functions of input and output.

To be specific, as shown in FIG. 6, the main body 510 can be provided with a first flow path 404 in an extending direction of the cavity 505. The first flow path 404 can be in communication with the glue melting unit 400, wherein, the first flow path 404 may also be a straight flow path so as to shorten the running route of the glue solution, thereby avoiding carbonization of the glue solution. Meanwhile, the first flow path may also be formed on the cavity 510, which can improve the integrity of the apparatus so as to avoid difficulties in assembly due to too many mounting positions.

As shown in FIG. 6, a diameter-expanding step 507 is formed at a joint (or a junction, or a transitional position) between the first flow path 404 and the cavity 505; the input one-way valve 503 is fixedly mounted on the diameter-expanding step 507, wherein, the diameter-expanding step 507 is formed by diameter expanding in a direction from the first flow path to the cavity 505. The input one-way valve 503 is fixedly mounted to the diameter expanding step 507.

The output one-way valve 504 is provided in an interior of the left end of the cavity 505. The interior of the left end of the cavity 505 can be fixedly provided with a position limiting ring. The output one-way valve 504 is fixedly mounted on the position limiting ring, and is in an inner side of the position limiting ring.

Of course, the FIGS. 6 and 26-27 only illustrate the embodiments of the glue injection unit 500 as examples, while the glue injection unit 500 in the present application is not limited thereby. All improvements made under the spirit provided by the present application also belong to the protection scope of the present application.

In another embodiment as shown in FIGS. 28 to 32, the cavity 505 can include a horizontal flow path 514 and a vertical flow path 513. An end of the horizontal flow path 514 is in communication with a bottom end of the vertical flow path 513; the other end of the horizontal flow path 514 is provided with the output one-way valve 504; and an upper end of the vertical flow path 513 is provided with the input one-way valve 503.

It can be seen that the cavity 505 is in an "L" shape as a whole, and the upper end of the vertical flow path 513 is led into the glue melting unit 400. The glue melting unit 400 preferably adopts a structure that performs glue melting by using a turntable 402 and a fixed member 403 cooperatively in a manner of melting for immediate consumption. During the glue melting process of the glue melting unit 400, the glue solution enters the cavity 505 from the input one-way valve 503 in real time. When the plunger pump 502 executes an expelling action, the glue solution is expelled by the output one-way valve 504.

In one embodiment, the input one-way valve 503 and the output one-way valve 504 can have a plurality of shape and constructions, such as spring one-way valve, swing one-way valve and gravity one-way valve, etc., wherein, the input one-way valve 503 and the output one-way valve 504 can be one-way valves of the same type, and can also be one-way valves of different types, and the present application does not make any limitation to this.

Considering that the input one-way valve 503 and output one-way valve 504 of this embodiment are used in glue injection works, and are generally used in a working scenario of "melting for immediate consumption", therefore, in this embodiment, both the input one-way valve 503 and output one-way valve 504 are preferably selected to be spring one-way valves.

Figure 31:
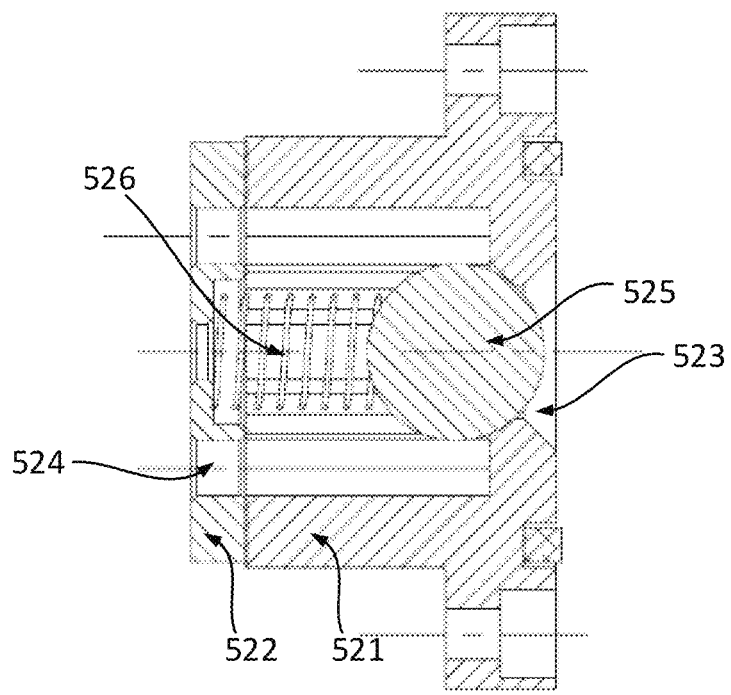
FIG. 31 is a schematic structural diagram of the input one-way valve provided by one embodiment of the present application.

As shown in FIG. 31, the input one-way valve 503 can include a first base 522 and a first valve seat 521. The first valve seat 521 is fixedly connected to the main body 510. The first base 522 is provided with a first outlet 524, and the first valve seat 521 is provided with a first inlet 523. The first base 522 and the first valve seat 521 form a first receiving cavity; the first outlet 524 and the first inlet 523 are led into the first receiving cavity. The first receiving cavity is provided with a first spring 526 and a first blocking member 525 therein; an end of the first spring 526 abuts the first base 522 while the other end thereof abuts the first blocking member 525 to block the first inlet 523.

After the first blocking member 525 compresses the first spring 526, the first inlet 523 is opened. The glue solution enters the first receiving cavity from the first inlet 523, and then flows out from the first outlet 524 and into the cavity 505. The first outlet 524 can include at least one through-hole provided on the first base 522. As shown in FIG. 31, the first outlet 524 includes a plurality of through-holes arranged in a circumferential direction, and the circumference along which the plurality of through-holes are arranged is greater than an outer diameter of the first spring 526. Preferably, the first spring 526 can be a cylindrical spring. The first receiving cavity also can be cylindrical shaped, and extends along a deformation direction of the first spring 526.

Figure 32:
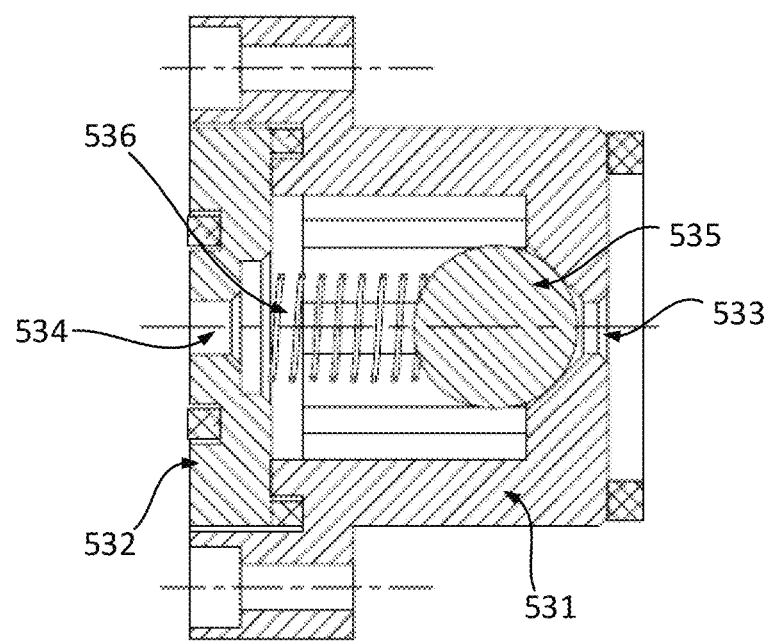
FIG. 32 is a schematic structural diagram of the output one-way valve provided by one embodiment of the present application.

As shown in FIG. 32, the output one-way valve 504 can include a second base 532 and a second valve seat 531; the second base 532 is fixed connected to the main body 510; the second base 532 is provided with a second outlet 534, and the second valve seat 531 is provided with a second inlet 533; the second base 532 forms a second receiving cavity with the second valve seat 531; the second outlet 534 and the second inlet 533 are led into the second receiving cavity; the second receiving cavity is provided with a second spring 536 and a second blocking member 535 therein; an end of the second spring 536 abuts the second base 532, and the other end thereof abuts the second blocking member 535 to block the second inlet 533.

After the second blocking member 535 compresses the second spring 536, the second inlet 533 is opened. The glue solution enters the first receiving cavity from the second inlet 533, and then flows out from the second outlet 534 and into the cavity 505. The second outlet 534 can include at least one through-hole provided on the second base 532. As shown in FIG. 32, the second outlet 534 includes one through-hole which is provided at a position of a center (or a circle center) of the second base 532. Preferably, the second spring 536 can be a cylindrical spring. The second receiving cavity also can be cylindrical shaped, and extends along a deformation direction of the second spring 536.

What needs to be explained is that, both the opening and closing of the input one-way valve 503 and the output one-way valve 504 are related to the pressure differentials inside and outside the cavity 505, wherein, an initial state (a state in which the first blocking member 525 and the second blocking member 535 do not move) of the first spring 526 and the second spring 536 can be a non-deformation state, at this moment, the first blocking member 525 and the second blocking member 535 can be displaced as long as a pressure differential is generated inside and outside the cavity 505; besides, the initial state of the first spring 526 and the second spring 536 may also be a compressed state, at this moment the first blocking member 525 and the second blocking member 535 can be displaced only when a certain pressure differential is produced inside and outside the cavity 505. Preferably, this embodiment takes the solution in which the initial state of the first spring 526 and the second spring 536 is a compressed state as a preferred solution.

In this embodiment, the parts of the first blocking member 525 and the first inlet 523 are adapted to each other so as to achieve a sealing effect. For example, if the first inlet 523 is circular, then the part of the first blocking member 525 that contacts the first inlet 523 is also circular and has the same diameter. Of course, an outer diameter (outer contour) of the first blocking member 525 gradually increases in a direction away from the first inlet 523, for example, the first blocking member 525 can be a tapered body (a cone, a pyramid, a round table and a prismatic table), and the first blocking member 525 can also be a ball as shown in FIG. 31.

Similar to the first blocking member 525, the parts of the second blocking member 535 and the second inlet 533 that contact each other are adapted to each other so as to achieve a sealing effect. For example, if the second inlet 533 is circular, then the part of the second blocking member 535 that contacts the first inlet 533 is also circular and has the same diameter. Of course, an outer diameter (outer contour) of the second blocking member 535 gradually increases in a direction away from the second inlet 533, for example, the second blocking member 535 can be a tapered body (a cone, a pyramid, a round table and a prismatic table), and the second blocking member 535 can also be a ball as shown in FIG. 32.

In this embodiment, the present application does not make any limitation to the positional relationship between the input one-way valve 503 and the output one-way valve 504, for example, as shown in FIG. 3, when the cavity 505 is a linear cavity 505, the second valve seat 531 and the first base 522 can be provided opposite to each other. At this moment, the opening and closing directions of the first blocking member 525 and the second blocking member 535 are the same.

Figure 30:
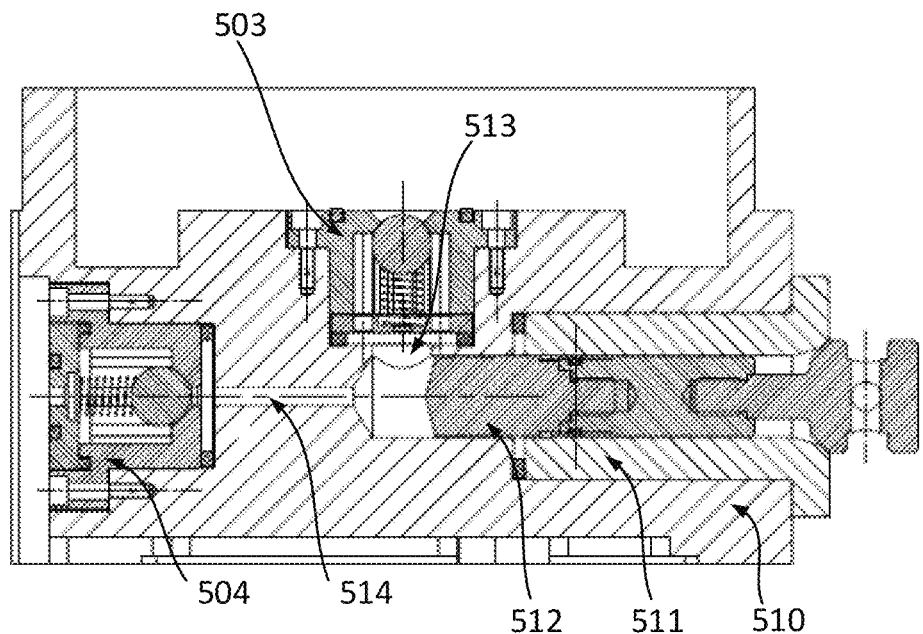
FIG. 30 is a section view of the glue injection unit in FIG. 28.

In this embodiment, the plunger pump 502 has reciprocating actions, namely, it can perform the suction action and expelling action repeatedly during the glue injection. The plunger pump 502 is mounted on the main body 510, and is between the input one-way valve 503 and the output one-way valve 504. To be specific, as shown in FIGS. 27 and 30, a wall of the main body 510 which is between the input one-way valve 503 and the output one-way valve 504 is provided with a mounting hole 506. The plunger pump 502 includes a plunger tube 511 provided on the mounting hole 506 and a plunger 512 located inside the plunger tube 511.

The plunger 512 may also be called a plunger rod. The plunger 512 accomplishes the suction and expelling actions by reciprocating movements in a lengthwise direction. When executing a suction action, the plunger 512 reduces the pressure in the cavity 505 to thereby open the input one-way valve 503 to input the glue solution. When executing an expelling action, the plunger 512 increases the pressure in the cavity 505 to thereby open the output one-way valve 504 to expel the glue solution.

In the embodiment shown in FIG. 6, the moving direction of the plunger 512 can be perpendicular to the extending direction of the cavity 505. The plunger 512 executes a suction action when moving upward, the volume of the cavity 505 is increased, and thus the pressure in the cavity 505 is decreased. When the pressure inside the cavity 505 is smaller than an external pressure, the first blocking member 525 of the input one-way valve 503 moves, and thereby the input one-way valve 503 opens to input the glue solution. At this moment, the second blocking member 535 of the output one-way valve 504 abuts the second valve seat 531 and cannot move, and is thereby kept closed.

Correspondingly, the plunger 512 executes an expelling action when moving downward, the volume of the cavity 505 is decreased, and thus the pressure inside the cavity 505 is increased. When the pressure inside the cavity 505 is larger than an external pressure, the second blocking member 535 of the output one-way valve 504 moves, and thereby the output one-way valve 504 is opened. At this moment, the first blocking member 525 of the input one-way valve 503 abuts the first valve seat 521 and cannot move, and is thereby kept closed.

Figure 29:
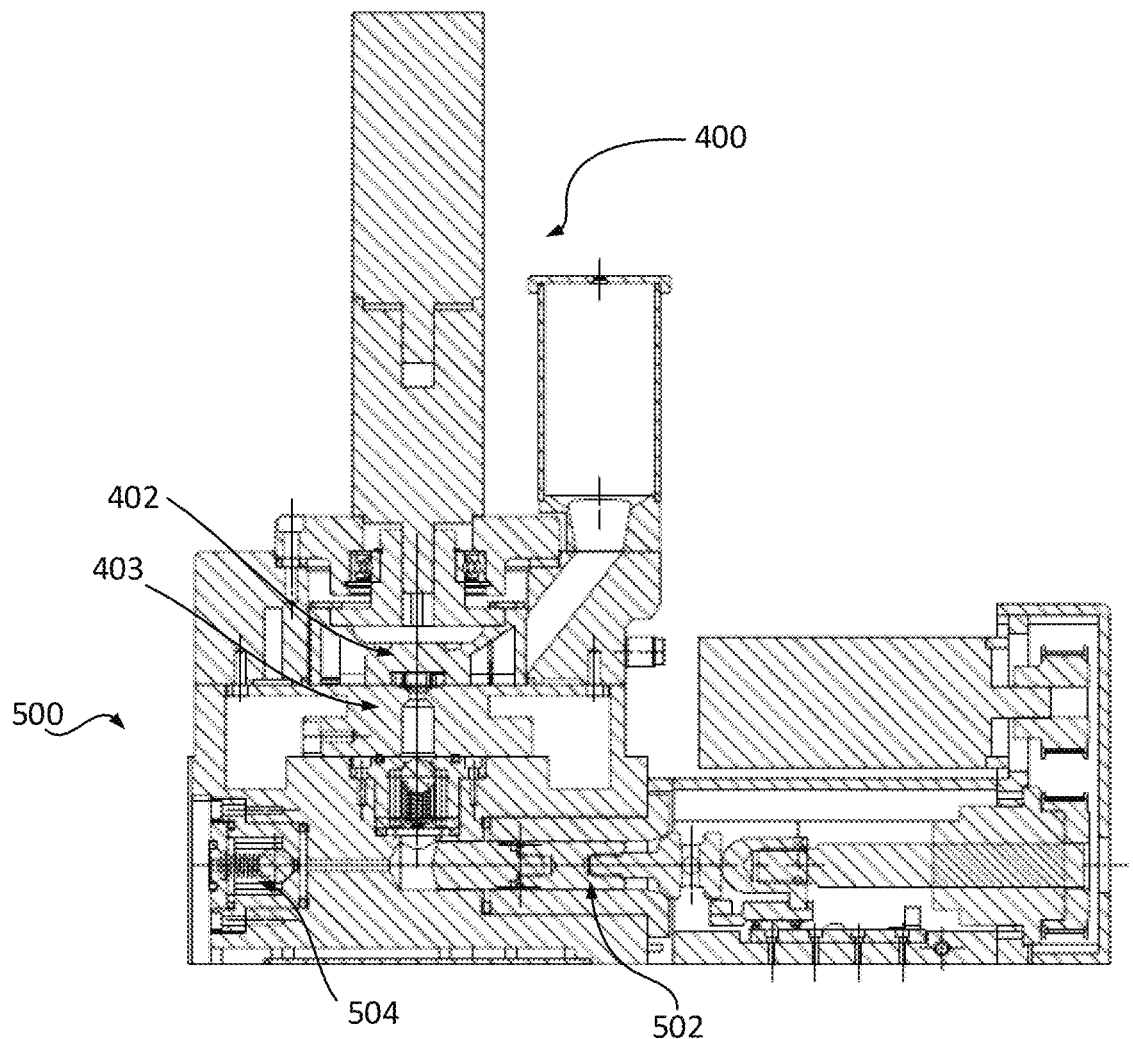
FIG. 29 is a section view of FIG. 28.

Besides, in the embodiment shown in FIG. 29, the mounting hole 506 can be provided at an end of the horizontal flow path 514 and/or a bottom of the vertical flow path 513; the plunger 512 moves in an extending direction of the horizontal flow path 514. It can be seen that the lengthwise direction of the plunger is on an extension line of the horizontal flow path 514. In order to facilitate mechanical machining, the plunger tube 511 and the cavity 505 can be provided coaxially. By such a setting, the space occupied by the whole glue injection apparatus can be further reduced.

In this embodiment, the plunger 512 executes a suction action when moving rightward (when the reader faces the FIG. 29), the volume of the cavity 505 is increased, and thus the pressure inside the cavity 505 is decreased. When the pressure inside the cavity 505 is smaller than an external pressure, the first blocking member 525 of the input one-way valve 503 moves, and thereby the input one-way valve 503 is opened to input the glue solution. At this moment, the second blocking member 535 of the output one-way valve 504 abuts the second valve seat 531 and cannot move, and is thereby kept closed.

Correspondingly, the plunger 512 executes an expelling action when moving leftward, the volume of the cavity 505 is decreased, and thus the pressure inside the cavity 505 is increased. When the pressure inside the cavity 505 is larger than an external pressure, the second blocking member 535 of the output one-way valve 504 moves, and thereby the output one-way valve 504 is opened to output the glue solution. At this moment, the first blocking member 525 of the input one-way valve 503 abuts the first valve seat 521 and cannot move, and is thereby kept closed.

In a preferred embodiment, the plunger pump 502 is connected with a control unit (not shown); the control unit can control the distance of travel of the plunger 512. In this embodiment, the travel of the plunger 512 is adapted to the output amount of the glue solution, whereby the control unit can control the glue injection amount by controlling the travel of the plunger 512.

In this embodiment, the control unit may be a hardware entity unit, and may also be a software program module, and obviously can also be a combination of software and hardware. For example, the control unit may be a computer, a PLC and a main control board, etc. To be specific, the control unit can control the travel of the plunger 512 by, for example, controlling the servo motor 501 which drives the plunger 512. To be specific, the control unit can control the travel of the plunger 512 by controlling the number of revolution of the servo motor 501.

Another embodiment of the present application also provides a glue injection apparatus, comprising: a glue melting unit 400 including a rotatable turntable 402 and a fixed member 403; a feed groove being provided on a surface of the turntable 402 facing the fixed member 403; a raw material in the feed groove being melted into glue solution when the turntable 402 is rotated relative to the fixed member 403; and a glue injection unit 500 according to any of the above mentioned embodiments.

Further, in order to make full use of the "weissenberg effect", the fixed member 403 is provided with a glue outlet through-hole; the glue outlet through-hole is in communication with an input one-way valve 503 which is provided adjacent to the glue outlet through-hole.

Another embodiment of the present application also provides a glue injection molding device, comprising: a glue injection apparatus as mentioned above; and a mold (not shown). The glue injection molding device of this embodiment can also be called an injection molding device or a plastic injection molding device.

Any numerical value cited in this text includes all values including the lower and the upper values, in increments of one unit, between the lower limiting value and the upper limiting value, provided that there is a separation of at least two units between any lower value and any higher value. For example, if it is elaborated that the value of the number of a component or of a process variable (such as temperature, pressure, time, etc.) is from 1 to 90, preferably from 20-80, and more preferably from 30-70, then the purpose is to illustrate that the Description also explicitly lists the values such as 15 to 85, 22 to 68, 43 to 51 and 30-32. As for values smaller than 1, it shall be appreciated appropriately that one unit is 0.0001, 0.001, 0.01 or 0.1. These are only examples for listed for purpose of explicit expression, and it can be regarded that all possible combinations of values listed between the minimum value and the maximum value have been explicitly elaborated in a similar way in the Description.

Unless otherwise stated, all ranges include the endpoints and all numbers that fall between the endpoints. The use of "about" or "approximately" together with a range applies to both ends of the range. Therefore, the expression "about 20 to 30" is intended to cover "about 20 to about 30", and at least includes the expressly pointed out endpoints.

The disclosures of all articles and references, including patent applications and publications, are incorporated therein by reference for all purposes. The term "substantially consists of . . . " which describes a combination should include the determined elements, components, parts or steps, as well as other elements, components, parts or steps that in substance do not affect the basic novel features of the combination. The use of terms "contain" or "comprise" to describe the combination of the elements, components, parts or steps therein also take into account the embodiment substantially constructed by these elements, components, parts or steps. Here, by using the term "can", it is intended to explain that any described attribute that covers by the term "can" is selectable.

Multiple elements, components, parts or steps can be provided by a single integral element, component, part or step. Alternatively, a single integral element, component, part or step can be divided into a plurality of separated elements, components, parts or steps. The terms "a" or "one" used to describe the elements, components, parts or steps are not intended to exclude other elements, components, parts or steps.

It should be understood that the above description is for graphic illustration rather than limitation. By reading the above description, many embodiments and applications other than the provided examples would be obvious for persons skilled in the art. Therefore, the scope of the teaching should be determined not with reference to the above description, but should instead be determined with reference to the whole range of the appended claims, along with the full scope of equivalents possessed by the claims. The disclosures of all articles and references, including patent applications and publications, are incorporated herein by reference for purpose of being comprehensive. The omission in the foregoing claims of any aspect of the subject matter that is disclosed herein is not a disclaimer of such subject matter, nor should it be regarded that the inventor did not consider such subject matter to be part of the disclosed inventive subject matter.

The invention claimed is:

1. A glue injection apparatus, wherein comprising:
    a glue melting unit including a rotatable turntable and a fixed member, wherein a feed groove is provided on a surface of the turntable facing the fixed member, and wherein raw material in the feed groove is melted into glue solution when the turntable rotates relative to the fixed member; and
    a glue injection unit in communication with the glue melting unit, wherein the glue solution enters the glue injection unit when the turntable rotates, the glue injection unit being capable of injecting the glue solution inside it into a mold.

2. The glue injection apparatus according to claim 1, wherein the turntable has a glue melting surface provided with the feed groove;
    a groove width of the feed groove gradually decreases from a periphery to a center of the glue melting surface, and/or, a curvature change of a groove depth of the feed groove gradually decreases from the periphery to the center of the glue melting surface.

3. The glue injection apparatus according to claim 1, wherein the turntable has a glue melting surface provided with the feed groove, and wherein the glue melting surface protrudes or sinks from the periphery to the center thereof.

4. The glue injection apparatus according to claim 1, wherein the feed groove extends along a straight line or a curved line.

5. The glue injection apparatus according to claim 1, wherein a glue outlet through-hole in communication with the feed groove is provided at a center of the fixed member; the glue injection unit has a glue solution outlet; a glue solution flow path is provided between the glue outlet through-hole and the glue solution outlet; the glue solution flow path includes a vertical flow path and a horizontal flow path; an upper end of the vertical flow path is in communication with the glue outlet through-hole; and a lower end of the vertical flow path is in communication with the horizontal flow path.

6. The glue injection apparatus according to claim 1, wherein the glue injection apparatus comprises:
    a main body provided with a cavity;
    an input one-way valve in communication with the cavity, which is opened when a pressure differential outside the cavity is greater than an internal pressure differential, so as to input the glue solution;
    an output one-way valve in communication with the cavity, which is opened when a pressure differential inside the cavity is greater than an external pressure differential, so as to expel the glue solution;
    a plunger pump in communication with an interior of the cavity; the input one-way valve being opened and the output one-way valve being closed when the plunger pump executes a suction action; the output one-way valve being opened and the input one-way valve being closed when the plunger pump executes an expelling action.

7. The glue injection apparatus according to claim 6, wherein a mounting hole is provided on a wall of the main body which is between the input one-way valve and the output one-way valve, wherein the plunger pump includes a plunger tube provided on the mounting hole and a plunger positioned inside the plunger tube.

8. The glue injection apparatus according to claim 1, further comprising:
    an electromagnetic heating unit capable of heating the fixed member by electromagnetic induction.

9. The glue injection apparatus according to claim 8, wherein the electromagnetic heating unit is provided on a side of the fixed member facing away from the turntable, wherein a heat preservation material is provided between the electromagnetic heating unit and the fixed member.

10. The glue injection apparatus according to claim 1, further comprising:
    a temperature equalization unit provided with a heating mechanism and a temperature equalization cavity; the glue solution entering the temperature equalization cavity when the turntable rotates; the heating mechanism capable of maintain the glue solution in the temperature equalization cavity at a same temperature; and the temperature equalization unit being in communication with the glue injection unit so as to deliver the glue solution into the glue injection unit.

11. The glue injection apparatus according to claim 1, wherein the glue melting surface protrudes or sinks from the periphery to the center thereof.

12. The glue injection apparatus according to claim 11, wherein the glue melting surface is a tapered surface with a degree of taper from 1:3 to 5:1.

13. The glue injection apparatus according to claim 1, wherein the rotatable turntable is disposed above the fixed member, a glue outlet through-hole is disposed at a center position of the fixed member; and the glue outlet through-hole communicates with the temperature equalization unit.

14. The glue injection apparatus according to claim 13, wherein the feed groove extends along at least one of the following curved lines: an arc line, a cycloid, a hyperbola, a spiral line or an involute.

15. The glue injection apparatus according to claim 6, wherein the cavity extends along a straight line; the input one-way valve is provided in an end of the cavity; and the output one-way valve is provided in the other end of the cavity.

16. The glue injection apparatus according to claim 15, wherein the cavity includes a horizontal flow path and a vertical flow path; an end of the horizontal flow path is in communication with a bottom end of the vertical flow path; the other end of the horizontal flow path is provided with the output one-way valve; and an upper end of the vertical flow path is provided with the input one-way valve.

17. The glue injection apparatus according to claim 1, wherein the glue melting unit includes a shell; the turntable and the fixed member are provided in the shell; the shell is provided with a first cooling tube; and water can be fed into the first cooling tube to cool the shell.

18. The glue injection apparatus according to claim 1, further comprising:

a pressure measuring unit connected to the glue injection unit, the pressure measuring unit being used to measure an injection pressure in the glue injection unit; and a control unit connected to the pressure measuring unit and the glue injection unit, the control unit capable of controlling the glue injection unit to stop injecting when the injection pressure reaches a predetermined pressure.

19. The glue injection apparatus according to claim 10, further comprising:

a temperature detecting mechanism and a control mechanism, the temperature detecting mechanism capable of detecting a temperature in the temperature equalization cavity;

wherein the control mechanism is connected with the heating mechanism and the temperature detecting mechanism, and wherein the control mechanism is capable of controlling a target temperature of the heating mechanism according to the temperature detected by the temperature detecting mechanism.

20. A low-pressure gluing system for an electronic element, comprising:

a mold having a mold cavity that can receive an element to be glued and a glue inlet that is led into the mold cavity;

a glue injection apparatus according to claim 1, which can inject glue into the mold cavity.

* * * * *